US011935951B2

(12) United States Patent
Tsai et al.

(10) Patent No.: US 11,935,951 B2
(45) Date of Patent: *Mar. 19, 2024

(54) METAL-INSENSITIVE EPITAXY FORMATION

(71) Applicant: Taiwan Semiconductor Manufacturing Company, Ltd., Hsin-Chu (TW)

(72) Inventors: Chun Hsiung Tsai, Hsinchu County (TW); Yuan-Ko Hwang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/981,639

(22) Filed: Nov. 7, 2022

(65) Prior Publication Data
US 2023/0063033 A1 Mar. 2, 2023

Related U.S. Application Data

(60) Continuation of application No. 17/068,231, filed on Oct. 12, 2020, now Pat. No. 11,495,685, which is a
(Continued)

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02447* (2013.01); *H01L 21/0245* (2013.01);
(Continued)

(58) Field of Classification Search
CPC .......... H01L 21/02447; H01L 21/0245; H01L 21/02529; H01L 21/02532;
(Continued)

(56) References Cited

U.S. PATENT DOCUMENTS 7,667,721 B2 2/2010 Yu et al.
8,362,575 B2 1/2013 Kwok et al.
(Continued)

FOREIGN PATENT DOCUMENTS

KR 10-2012-0086369 8/2012

OTHER PUBLICATIONS

Y. Bogumilowicz et al., "Chemical vapour etching of Si, SiGe and Ge with HCl; applications to the formation of thin relaxed SiGe buffers and to the revelation of threading dislocations," Institute of Physics Publishing, Dec. 17, 2004, pp. 127-134, Semicond. Sci. Technol. 20 (2005), France.
(Continued)

*Primary Examiner* — David C Spalla
(74) *Attorney, Agent, or Firm* — HAYNES AND BOONE, LLP

(57) ABSTRACT

The present disclosure provides a semiconductor device structure in accordance with some embodiments. In some embodiments, the semiconductor device structure includes a semiconductor substrate of a first semiconductor material and having first recesses. The semiconductor device structure further includes a first gate stack formed on the semiconductor substrate and being adjacent the first recesses. In some examples, a passivation material layer of a second semiconductor material is formed in the first recesses. In some embodiments, first source and drain (S/D) features of a third semiconductor material are formed in the first recesses and are separated from the semiconductor substrate by the passivation material layer. In some cases, the passivation material layer is free of chlorine.

20 Claims, 23 Drawing Sheets

Related U.S. Application Data continuation of application No. 16/383,963, filed on Apr. 15, 2019, now Pat. No. 10,804,395, which is a division of application No. 14/597,115, filed on Jan. 14, 2015, now Pat. No. 10,263,108.

(60) Provisional application No. 62/040,880, filed on Aug. 22, 2014.

(51) Int. Cl.
  *H01L 29/165* (2006.01)
  *H01L 29/66* (2006.01)

(52) U.S. Cl.
  CPC .. *H01L 21/02529* (2013.01); *H01L 21/02532* (2013.01); *H01L 21/02576* (2013.01); *H01L 21/02579* (2013.01); *H01L 21/0262* (2013.01); *H01L 21/02639* (2013.01); *H01L 29/165* (2013.01); *H01L 29/66545* (2013.01); *H01L 29/6659* (2013.01); *H01L 29/66636* (2013.01); *H01L 29/7833* (2013.01); *H01L 29/7834* (2013.01)

(58) Field of Classification Search
  CPC ......... H01L 21/02576; H01L 21/02579; H01L 21/0262; H01L 21/02639; H01L 29/165; H01L 29/66545; H01L 29/6659; H01L 29/66636; H01L 29/7833; H01L 29/7834; H01L 29/7848

See application file for complete search history.

(56) References Cited

U.S. PATENT DOCUMENTS

| | | | |
|---|---|---|---|
| 8,367,498 B2 | 2/2013 | Chang et al. |
| 8,404,546 B2 | 3/2013 | Woon et al. |
| 8,440,517 B2 | 5/2013 | Lin et al. |
| 8,497,528 B2 | 7/2013 | Lee et al. |
| 8,598,003 B2 | 12/2013 | Murthy et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,853,039 B2 | 10/2014 | Tsai et al. |
| 9,885,123 B2 | 2/2018 | Halpin et al. |
| 10,804,395 B2 * | 10/2020 | Tsai ................ H01L 29/7848 |
| 2005/0012146 A1 | 1/2005 | Murthy et al. |
| 2006/0234504 A1 | 10/2006 | Bauer et al. |
| 2007/0249168 A1 | 10/2007 | Rotondaro et al. |
| 2008/0315254 A1 | 12/2008 | Fukuda et al. |
| 2010/0093147 A1 | 4/2010 | Liao et al. |
| 2011/0027955 A1 | 2/2011 | Woon et al. |
| 2011/0068407 A1 | 3/2011 | Yeh et al. |
| 2012/0091469 A1 | 4/2012 | Park et al. |
| 2012/0295427 A1 | 11/2012 | Bauer et al. |
| 2013/0011983 A1 | 1/2013 | Tsai et al. |
| 2013/0049101 A1 | 2/2013 | Hsiao et al. |
| 2013/0328126 A1 | 12/2013 | Tsai et al. |
| 2014/0091308 A1 | 4/2014 | Dasgupta et al. |
| 2014/0197455 A1 | 7/2014 | Lee et al. |
| 2014/0252412 A1 | 9/2014 | Tsai et al. |
| 2014/0264348 A1 | 9/2014 | Tsai et al. |
| 2014/0264636 A1 | 9/2014 | Tsai et al. |
| 2015/0155386 A1 | 6/2015 | Hung et al. |
| 2015/0357436 A1 * | 12/2015 | Shen ................ H01L 29/7848 257/190 |
| 2015/0380488 A1 | 12/2015 | Chou et al. |
| 2016/0056290 A1 | 2/2016 | Tsai et al. |
| 2019/0245087 A1 | 8/2019 | Tsai et al. |
| 2021/0043770 A1 | 2/2021 | Tsai et al. |

OTHER PUBLICATIONS

V. Destefanis et al., "High pressure in situ HCl etching of Si1-xGex versus Si for advanced devices," Semiconductor Science and Technology, Sep. 16, 2008, pp. 9, Semicond. Sci. Technol. 23 (2008), France.

V. Destefanis et al., Low-thermal surface preparation, HCl etch and Si/SiGe selective epitaxy on (1 1 0) silicon surfaces, Semiconductor Science and Technology, Sep. 16, 2008, pp. 9, Semicond. Sci. Technol. 23 (2008), France.

Y. Bogumilowicz et al., "Selective chemical vapour etching of Si1-xGex versus Si with gaseous HCl," Semiconductor Science and Technology, Oct. 18, 2006, pp. 1668-1674, Semicond. Sci. Technol. 21 (2006), France.

J. M. Hartmann et al., Tensile-strained Si layers grown on Si0.6Ge0.4 and Si0.5Ge0.5 virtual substrates: I. Film thickness and morphology, Semiconductor Science and Technology, Mar. 7, 2007, pp. 354-361, Semicond. Sci. Technol. 22 (2007), France.

* cited by examiner

METAL-INSENSITIVE EPITAXY FORMATION

PRIORITY DATA

The present application is a continuation application of U.S. patent application Ser. No. 17/068,231, filed Oct. 12, 2020, which is a continuation application of U.S. patent application Ser. No. 16/383,963, filed Apr. 15, 2019, which is a divisional application of U.S. patent application Ser. No. 14/597,115, filed Jan. 14, 2015, issuing as U.S. Pat. No. 10,263,108, which claims the benefit of U.S. Provisional Application 62/040,880, filed Aug. 22, 2014, each of which is herein incorporated by reference in its entirety.

BACKGROUND

The semiconductor industry has progressed into nanometer technology process nodes in pursuit of higher device density, higher performance, and lower cost. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Despite groundbreaking advances in materials and fabrication, scaling planar device such as the conventional MOSFET has proven challenging. For example, such scaling-down also produces a relatively high power dissipation value. To overcome these challenges, IC industries look to novel structures and fabrication to deliver improved performance. One avenue of inquiry is the development of strained field effect transistor (FET) with enhanced mobility. However, the existing structure and fabrication method present issues associated with the metal contamination, which introduces device defects and other performance concerns.

Therefore, there is a need for a structure and method for a FET device to address these concerns for enhanced performance and reduced defects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
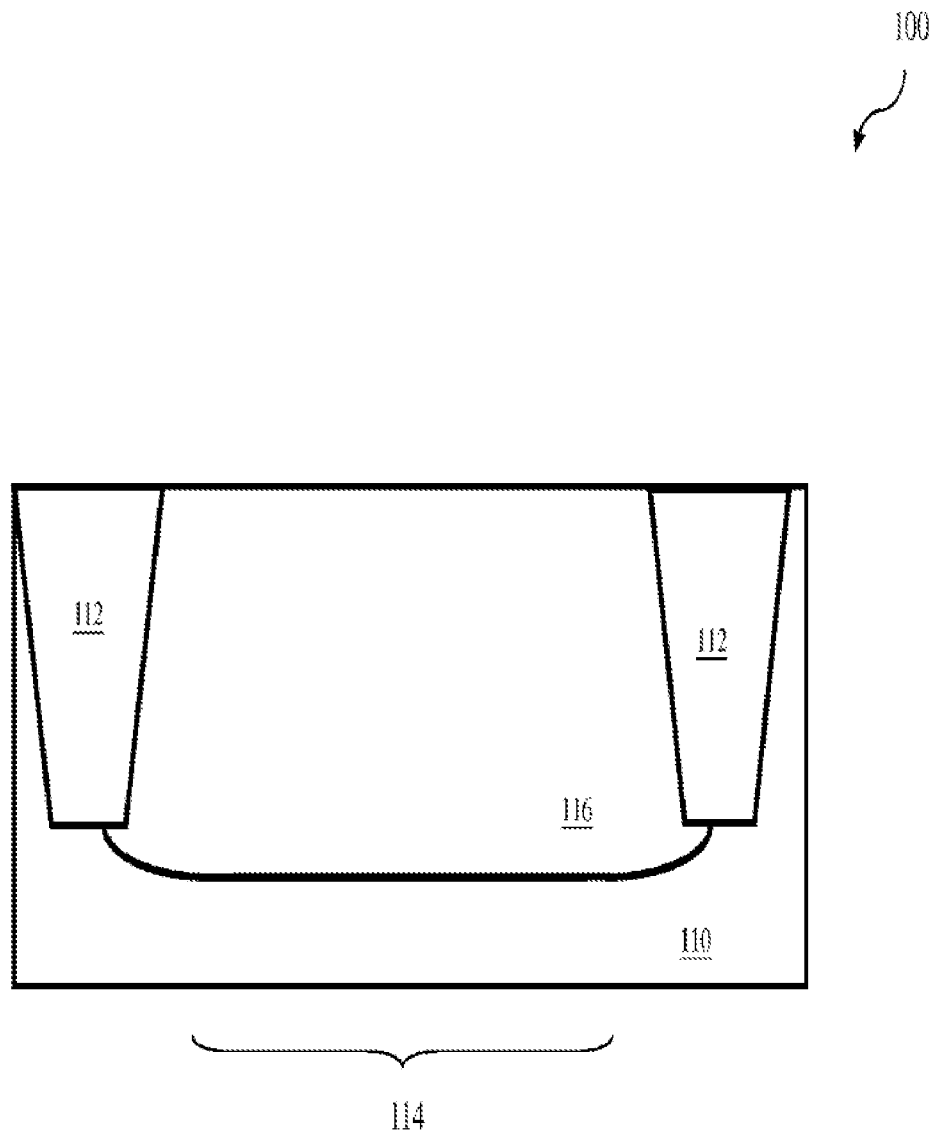
FIGS. 1A, 2, 3, 4A, 5A, 7 and 8A are sectional views of a semiconductor structure at various fabrication stages constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1A, 2, 3, 4A, 5A, 7 and 8A are sectional views of a semiconductor structure 100 at various fabrication stages constructed in accordance with some embodiments. FIGS. 1B, 4B, 5B and 8A are sectional views of the semiconductor structure at various fabrication stages constructed in accordance with some other embodiments. The semiconductor structure 100 and the method making the same are collectively described in accordance with some embodiments. In one embodiment, the semiconductor structure 100 includes one or more field effect transistor (FET).

Referring to FIG. 1A, the semiconductor structure 100 includes a semiconductor substrate 110. The semiconductor substrate 110 includes silicon. Alternatively, the substrate includes germanium, silicon germanium or other proper semiconductor materials. In another embodiment, the semiconductor substrate 110 may include a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

As various examples for illustration, the semiconductor structure 100 includes other components or features. In some embodiments, isolation features, such as various shallow trench isolation (STI) features 112, are formed in the semiconductor substrate 110 and define various semiconductor regions (or active regions) 114. The semiconductor regions 114 are separated and isolated from each other by the STI features 112. In one example, the top surface of the semiconductor substrate 110 and the top surfaces of the STI features 112 may be coplanar, resulting in a common top surface. In another example, the top surface of the semiconductor substrate 110 and the top surfaces of the STI features 112 are not coplanar, resulting in a three-dimensional structure, such as a fin FET (FinFET) structure.

In some embodiments, the formation of the STI features 112 includes, forming a hard mask with openings that define the regions for STI features; etching the semiconductor substrate 110 through the openings of the hard mask to form trenches in the semiconductor substrate; depositing one or more dielectric material to fill in the trenches; and performing a chemical mechanical polishing (CMP) process. As one embodiment for illustration, the depth of the STI features 112 ranges between about 50 nm and about 500 nm. In one example, the formation of the hard mask includes depositing a hard mask layer; a lithography process to form a patterned resist layer on the hard mask layer; and etching the hard mask layer using the patterned resist layer as an etch mask. In some examples, the deposition of the dielectric material further includes thermal oxidation of the trenches and then filling in the trenches by the dielectric material, such as silicon oxide, by CVD. In one example, the CVD process to fill in the trenches includes high density plasma CVD (HDPCVD). In some embodiments, the formation of the STI features 112 further includes removing the hard mask after CMP. In another embodiment, the hard mask includes a silicon oxide layer by thermal oxidation and a silicon nitride on the silicon oxide layer by chemical vapor deposition (CVD).

In FIG. 1A, the active region 114 is designed to form a FET, such as a p-type FET (pFET) or an n-type FET (nFET). In some embodiments, a doped well 116 may be formed in one or more active region 114. In some examples, the doped well 116 includes an n-type dopant, such as phosphorous (P), distributed in an active region where a pFET is to be formed. The n-type dopant may be introduced to the n-well 116 through an opening of the mask layer by a suitable doping process, such as one or more ion implantation. In some other examples, the doped well 116 includes a p-type dopant, such as boron (B), distributed in an active region where an nFET is to be formed. The p-type dopant may be introduced to the p-well 116 through an opening of the mask layer by a suitable doping process, such as one or more ion implantation. The STI features 112 further functions to define the dopants to the desired active regions. In the present example for illustration, the n-well 116 is formed in the semiconductor region 114. In one example, the doped well 116 may have a corresponding doping concentration ranging between about $10^{16}$ and $10^{18}$ cm$^3$. In another example, the doped well 116 may have a depth ranging between about 0.5 micrometers and 2 micrometers. A channel region 118 is defined in the active region 114 and serves as a conductive path when the corresponding FET is turned on during operations.

Figure 1B:
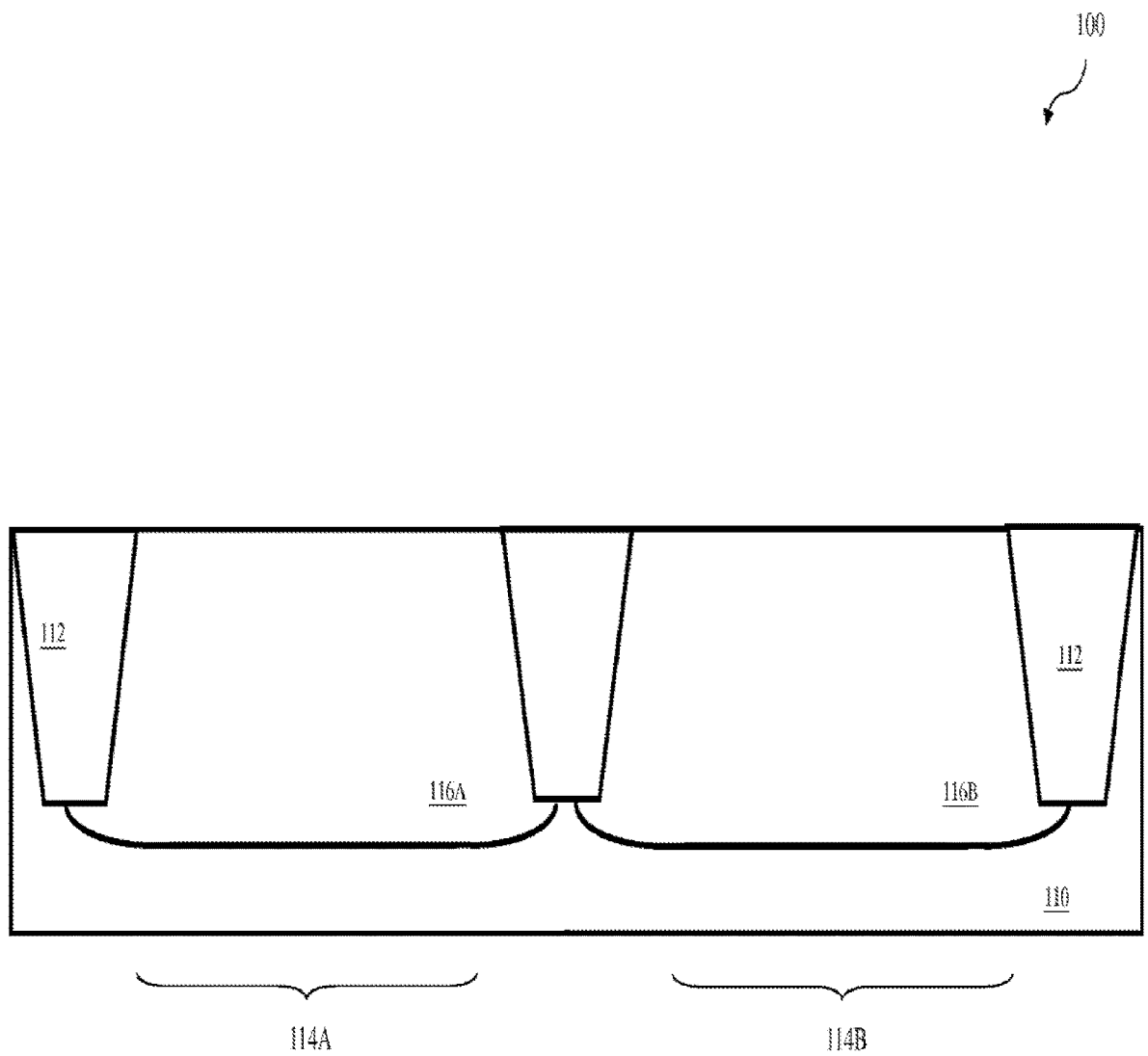
FIGS. 1B, 4B, 5B and 8B are sectional views of a semiconductor structure at various fabrication stages constructed in accordance with some other embodiments.

The semiconductor structure 100 may include more active regions. As illustrated in FIG. 1B, the semiconductor structure 100 includes a first active region 114A and a second active region 114B, which are separated by one STI feature 112 in some examples. The first active region 114A is designed for an nFET to be formed thereon and the second active region 114B is designed for a pFET to be formed thereon. In this case, a p-type doped well 116A is formed in the first active region 114A for the nFET and an n-type doped well 116B is formed in the second active region 114B for the pFET by a suitable procedure. In some examples, the procedure may include covering the first active region with a first mask (hard mask or soft mask patterned by lithography process); performing a first ion implantation to the second active region with an n-type dopant using the first mask as implantation mask; covering the second active region with a second mask (hard mask or soft mask patterned by lithography process); and performing a second ion implantation to the first active region with a p-type dopant using the second mask as implantation mask. In the following description, one exemplary active region and one FET are usually present for simplicity. However, two exemplary active regions and two FETs are present in some figures, in order to describe different embodiments, such as a nFET and a pFET that are different in terms of composition, configuration and/or formation.

Figure 2:
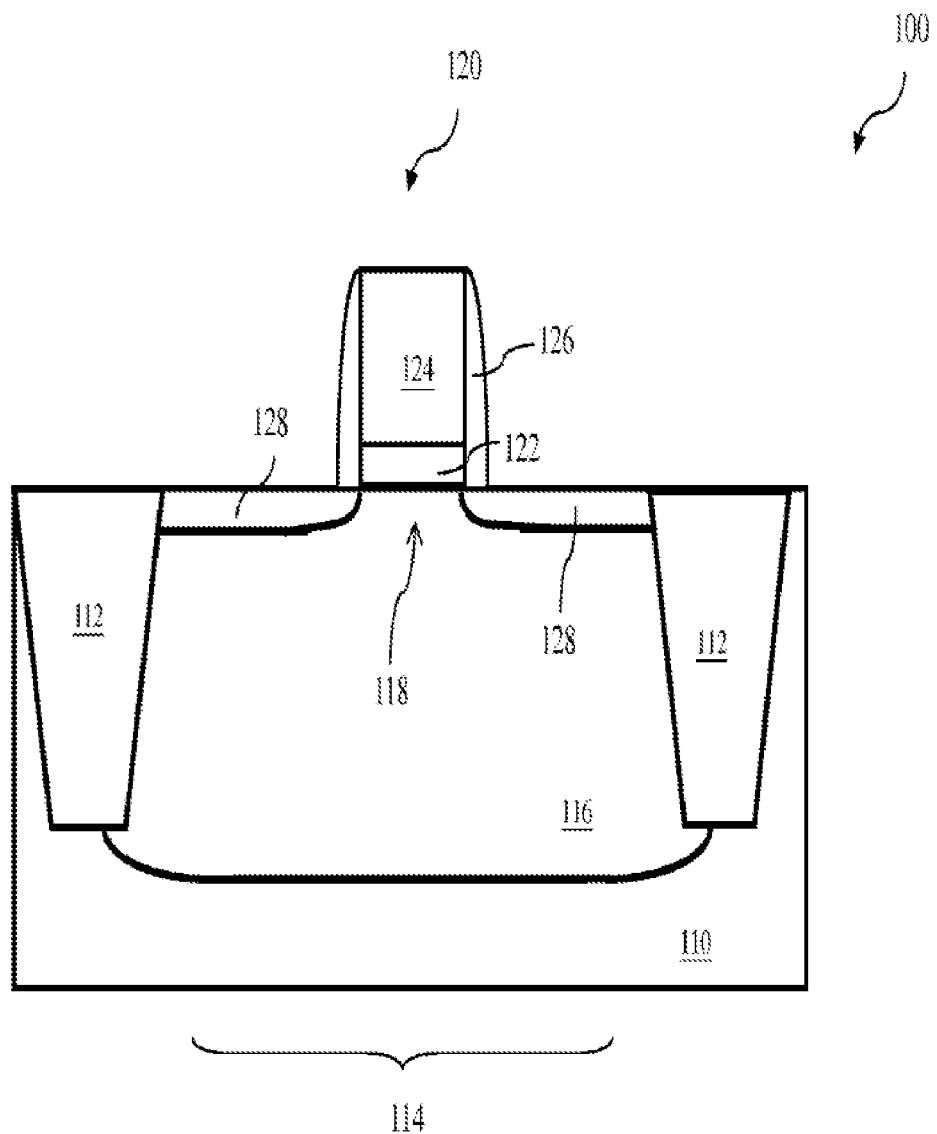

Referring to FIG. 2, a gate stack 120 is formed on the active region 114 and a channel region 118 is defined in the active region 114. The gate stack 120 is overlying the channel region 118 and is vertically aligned with the channel region 118. The gate stack 120 includes a gate dielectric feature 122 disposed on the semiconductor substrate 110 and a gate electrode 124 disposed on the gate dielectric feature 122. The semiconductor structure 100 may further include gate spacers 126 disposed on sidewalls of the gate stack 120.

The gate dielectric feature 122 includes a gate dielectric material, such as silicon oxide or a suitable dielectric material having a higher dielectric constant (high-k dielectric material). In the present embodiment, the gate dielectric feature 122 includes more than one dielectric material layers. For example, the gate dielectric feature 122 includes an interfacial dielectric layer, such as silicon oxide, and a high-k dielectric material layer on the interfacial layer.

The gate electrode 124 includes a conductive material layer, such as doped polysilicon, metal, metal alloy, metal silicide, or a combination thereof. In some embodiments, the gate electrode 124 includes more than one conductive material layers. For example, the gate electrode 124 includes a first conductive layer having a suitable work function on the gate dielectric feature 122 and a second conductive layer on the first conductive layer. In one example, the first conductive layer includes tantalum nitride or titanium nitride. In another example, the second conductive layer includes aluminum, tungsten, copper, doped polysilicon or a combination thereof.

The gate stack 120 is formed by a procedure that includes various deposition processes and patterning. The formation of the gate stack 120 is further described in accordance with some embodiments. In one embodiment, an interfacial layer is formed on the semiconductor substrate 110. The interfacial layer may include silicon oxide formed by a proper technique, such as an atomic layer deposition (ALD), thermal oxidation or UV-Ozone Oxidation. The interfacial layer may have a thickness less than 10 angstrom. A high k dielectric material layer is formed on the interfacial layer. The high-k dielectric layer includes a dielectric material having the dielectric constant higher than that of thermal silicon oxide, about 3.9. The high k dielectric material layer is formed by a suitable process such as ALD or other suitable technique. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides. The interfacial layer and the high k dielectric material layer constitute the gate dielectric layer.

In some embodiments, the gate electrode 124 includes polysilicon. A polysilicon layer is formed on the gate dielectric layer by a proper technique, such as CVD. In one example, a capping layer may be further formed between the high k dielectric material layer and the polysilicon layer by a proper technique, such as PVD. The capping layer may include titanium nitride (TiN), tantalum nitride (TaN) or a combination thereof in some examples. The capping layer may serve one or more functions, such as diffusion barrier, etch stop, and/or protection.

After the depositions, the gate material layers are patterned to form the gate stack 120 (or a plurality of gate stacks). The patterning of the gate stack 120 includes a lithography process and etching. A lithography process forms a patterned resist layer. In one example, the lithography process includes resist coating, soft baking, exposing, post-exposure baking (PEB), developing, and hard baking. The gate stack material layers are thereafter patterned by etching using the patterned resist layer as an etching mask. The etching process may include one or more etching steps. For example, multiple etching steps with different etchants may be applied to etch respective gate stack material layers.

In other embodiments, the patterning of the gate stack material layers may alternatively use a hard mask as an etching mask. The hard mask may include silicon nitride, silicon orynitride, silicon oxide, other suitable material, or a combination thereof. A hard mask layer is deposited on the gate stack material layers. A patterned resist layer is formed on the hard mask layer by a lithography process. Then, the hard mask is etched through the opening of the patterned resist layer, thereby forming a patterned hard mask. The patterned resist layer may be removed thereafter using a suitable process, such as wet stripping or plasma ashing.

The gate spacers 126 include a dielectric material and may have one or more films. In some embodiments, the fate spacers 126 include silicon oxide, silicon nitride, silicon oxynitride, other suitable dielectric material, or a combination thereof. The gate spacers 126 are formed by deposition and anisotropic etch (such as dry etch).

In some embodiments, the semiconductor structure 100 may include light-doped drain (LDD) features 128 formed in the active region 114 by a suitable process, such as ion implantation. The LDD features 128 have a doping type opposite to that of the doped well 116. For example for a pFET, the doped well 116 is n-type and the LDD features 128 are p-type. In another example for a nFET, the doped well 116 is p-type and the LDD features 128 are n-type. The LDD features 128, the dummy gate stack and gate spacers 126 may be formed in a collective procedure. For examples, the gate stack material layers are deposited and patterned to form the dummy gate stack; the LDD features are formed by ion implantation using the dummy gate stack (and STI features) to constrain the LDD features; and then the spacers are formed. In other embodiments, the LDD features 128 are optional and may be eliminated from the semiconductor structure 100.

Figure 3:
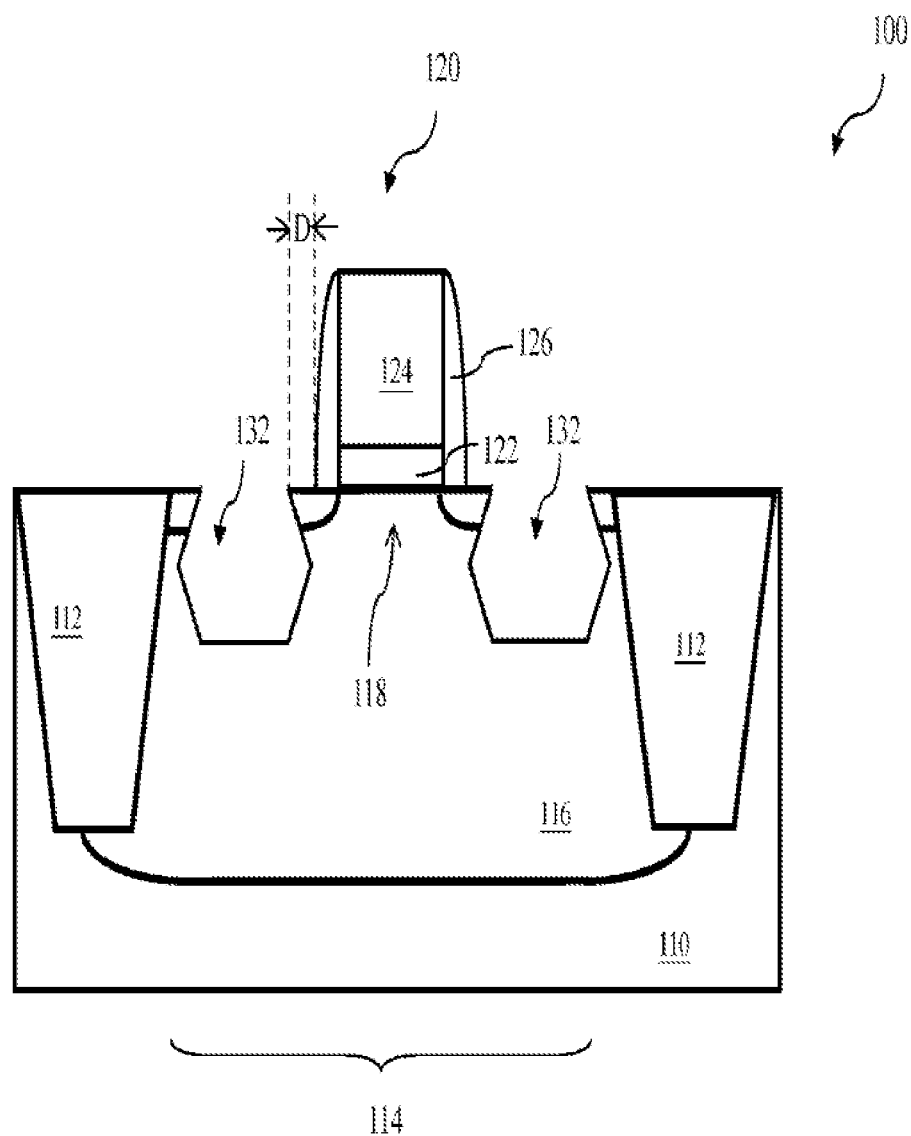

Referring to FIG. 3, recesses 132 are formed in the semiconductor substrate within the active region 114 by an operation that includes etching. In some embodiments, the recesses 132 may be formed using, such as a wet (and/or dry) etch process, selectively etch the material of the substrate 110. In furtherance of the embodiments, the gate stack 120, the gate spacers 126, and the STI 112 collectively function as an etching hard mask, thereby forming the recesses 132 in the source and drain regions. In some examples, an etchant such as carbon tetrafluoride (CF4), tetramethylammonium hydroxide (THMA), other suitable etchant, or a combination thereof is used to form the recesses 132. In some embodiments, the recesses 132 are formed with a width ranging from 50 Å and about 400 Å. A cleaning process may follow the etching process using a suitable chemical. The recesses 132 are substantially aligned with the gate structure, particularly aligned with outer edges of the gate spacers 126. As labeled in FIG. 3, the horizontal distance "D" is substantially zero in some examples. In some other examples, the distance "D" is greater than zero due to directionality of the etching process and/or the shadowing effect of the gate stacks 120 during the etching process. In some other examples when a wet etchant is used, lateral etch may additionally undercut the spacers 126. In this case, the distance "D" may be less than zero or negative, which means undercut. The recesses 132 may have different geometries, such as hexagonal, depending on design and tuning of the etching process. For example, a wet etching process is substantially non-directional isotropic but the etch rate is related to the crystal orientation of a substrate surface to be etched.

In experiments, it is found that the metal residuals, such as noble metals, may present in the recesses 132. The metal residuals may be introduced to the recesses during the operation to form the recesses 132, such as wet etch, dry etch, and/or cleaning process. The metal residuals are identified, through our experiments and failure mode analysis, to be the root cause of defects formed in the substrate 110 during subsequent operations to fill the recesses 132. In the present embodiments, the defects are formed through a mechanism of metal-assisted silicon etching. When chlorine is involved in the subsequent operations for filling the recesses, the metal residuals function as catalyst during chlorine-containing etching. Particularly, the silicon beneath the noble metal is etched much faster than the silicon without noble metal coverage. As a result, the noble metal sinks into the silicon substrate, generating pores or rough profile in the substrate. This will introduce defects, such as micro-porous structures to the substrate. The present disclosed method and structure are designed to address the issues.

Figure 4A:
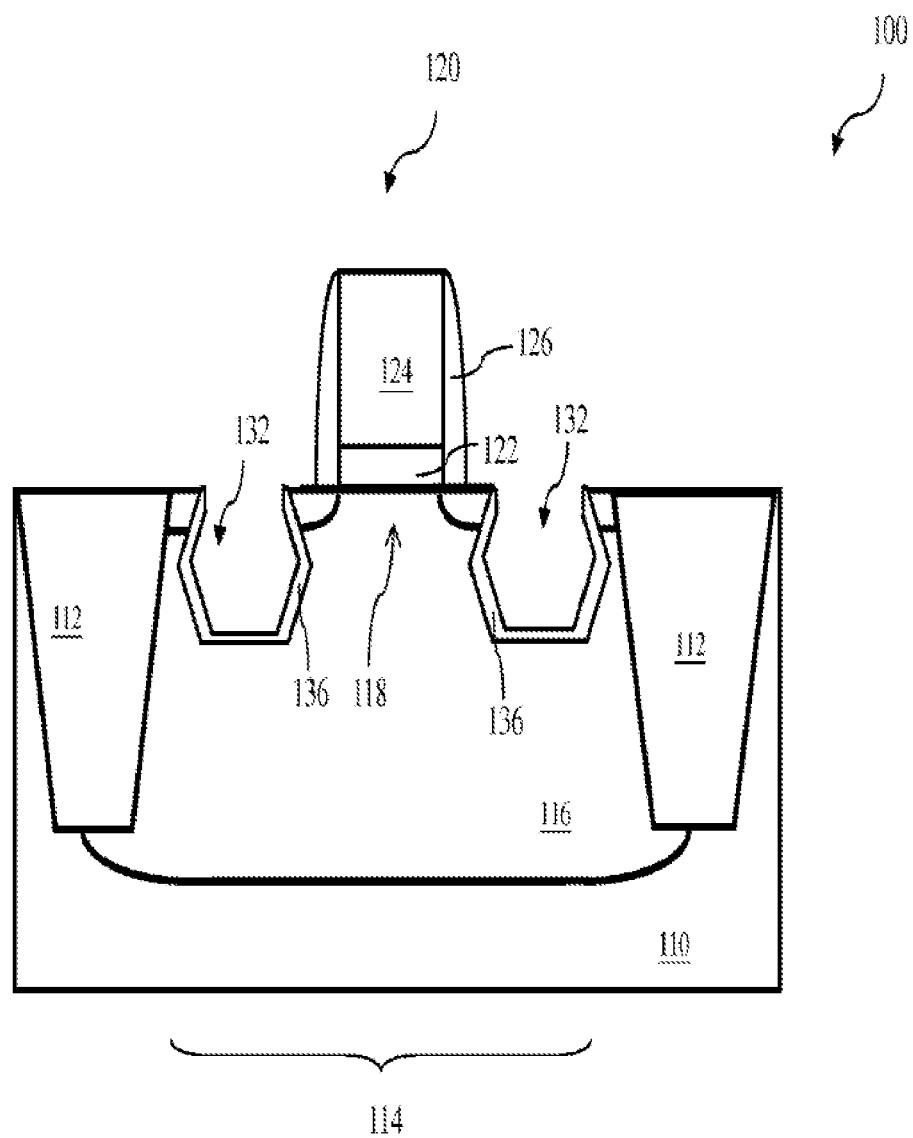

Referring to FIG. 4A, a passivation layer 136 is formed on the recesses 132 to cover the surfaces of the recesses 132. The passivation layer 136 is designed with composition and thickness to effectively isolate the metal residuals from the chlorine chemical during the subsequent operations. The passivation layer 136 effectively eliminates (or substantially reduces) the metal assisted silicon etching, and accordingly eliminates the formation of the associated defects. In some embodiments, the passivation layer 136 includes carbon, germanium, silicon carbide or silicon germanium. The passivation layer 136 is epitaxially grown on the surfaces of the recesses 132 and so is in crystalline structure. Thus, the subsequent operations can epitaxially grow on the passivation layer 136 and fill the recesses 132 with a semiconductor material in crystalline structure. During the formation of the passivation layer 136, the precursor is free of chlorine (Cl) to avoid direct reaction between chlorine and the metal residuals. Since the precursor is free of chlorine, the formation of the passivation layer 136 does not involve etching and is nonselective. The passivation layer 136 may also be formed on other regions, such as on the gate stack and STI features. Those unexpected portions of the passivation layer in other regions will be removed by subsequent operations, such as deposition and etching process to fill the recesses. In some examples, the passivation layer 136 includes silicon or silicon carbide formed by a deposition with a precursor free of Cl. In some embodiments, the passivation layer 136 has a thickness ranging from about 1 nm to about 4 nm.

Figure 4B:
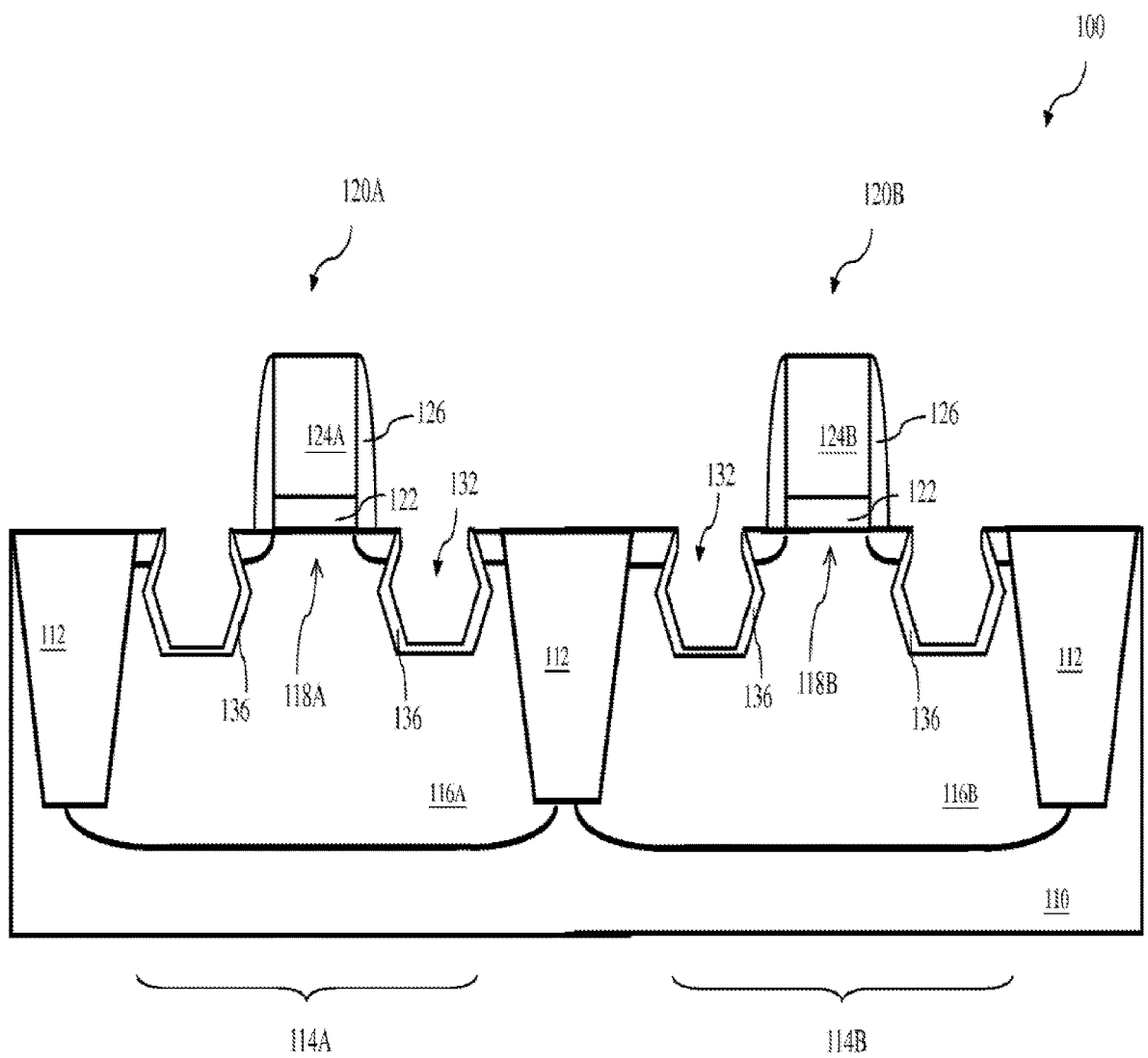

In one embodiment, the passivation layer 136 is a silicon carbide layer formed by a suitable process, such as CVD process, that epitaxially grows a silicon carbide layer using a precursor free of Cl. In furtherance of the embodiment, the precursor includes monomethylsilane ($CH_3SiH_3$ or MMS) and silane ($SiH_4$). The silicon-containing chemical in the precursor may alternatively include disilane ($SiH_6$), trisilane ($Si_3H_8$), other suitable silicon-containing chemical or a combination thereof. In some examples, the precursor is free of chlorine. In the present example, the precursor is further free of dopant-containing chemical (free of phosphorous or other n-type dopant) as well. The passivation layer 136 is designed to be effective for diffusion prevention and inertness to etching. As an example for illustration, phosphorous is another issue in addition to the metal-assistant silicon etching. The phosphorous diffusion leads to the leakage and further leads to the degradation of device performance. The dopant-free precursor and corresponding dopant-free passivation layer 136 formed thereby address the above issues. In another examples, the precursor is provided with proper gas flows and partial pressures such that the epitaxially grown passivation layer 136 of SiC has a carbon concentration ranging from about 1.8% to about 3% (atomic percentage). The SiC layer with such low carbon concentration is not suitable for strain effect but is more effective as the passivation layer for isolating and preventing diffusion. In yet some examples, the passivation layer 136 is formed in both the recesses for nFET S/D regions and the recesses for pFET S/D regions, such as illustrated in FIG. 4B. In FIG. 4B, the first active region 114A is for an nFET and the second active region 114B is for a pFET. In some examples, the passivation layer 136 is dopant-free; has a carbon concentration ranging from about 1.8% to about 3% (atomic percentage); and is formed in formed in both the recesses for nFET S/D regions and the recesses for pFET S/D regions.

In some embodiment, the passivation layer 136 is a silicon carbide layer formed by a suitable process, such as CVD process. The SiC passivation layer 136 includes phosphorous (P) dopant with a low P doping concentration less than $1 \times 10^{20}/cm^3$, or $0 \sim 1 \times 10^{20}/cm^3$. The P dopant may be introduced by in-situ doping. During the epitaxial growth of the passivation layer 136, the precursor further includes phosphorous-containing chemical, such as phosphine ($PH_3$). The P concentration in the SiC passivation layer 136 may be not enough for S/D features. S/D features of a nFET may have a P dopant concentration greater than $1 \times 10^{20}/cm^3$. The P concentration of the SiC passivation layer 136 is so tuned such that to provide a grading P concentration with smooth transition from the substrate to the S/D features and the P concentration is not too high to cause leakage concerns.

In some embodiments, the passivation layer 136 is a silicon layer formed by epitaxially growing a silicon layer using a precursor free of Cl. In furtherance of the embodiment, the precursor includes $SiH_4$ or other silicon-containing chemical. In the present embodiment, the precursor has no dopant (free of phosphorous and boron-containing chemical) to prevent dopant diffusion. Accordingly, the corresponding silicon passivation layer 136 is dopant-free. In some examples, the precursor during the epitaxy growth has a low partial pressure ranging from about 1 Torr to about 10 Torr.

In some embodiments, the passivation layer 136 is a silicon germanium (SiGe) layer formed by epitaxially growing a silicon germanium layer using a precursor free of Cl. In furtherance of the embodiment, the precursor includes a silicon-containing chemical (such as $SiH_4$) and a germanium-containing chemical ($GeH_4$). In the present embodiment, the precursor has no dopant (free of phosphorous and boron-containing chemical) to prevent dopant diffusion. Accordingly, the corresponding SiGe passivation layer 136 is dopant-free (free of boron or other p-type dopant). In some examples, the SiGe passivation layer 136 has a Ge concentration ranging from about 10% to about 40% for enhanced effectiveness of the passivation layer 136. In yet some examples, the SiGe passivation layer 136 is formed in both the recesses for nFET S/D regions and the recesses for pFET S/D regions, such as illustrated in FIG. 4B. In FIG. 4B, the first active region 114A is for an nFET and the second active region 114B is for a pFET. In some examples, the SiGe passivation layer 136 is dopant-free; has a germanium concentration ranging from about 10% to about 40% (atomic percentage); and is formed in formed in both the recesses for nFET S/D regions and the recesses for pFET S/D regions. In some examples, the precursor during the epitaxy growth has a low partial pressure ranging from about 1 Torr to about 10 Torr.

In some embodiments, a fluorine (F) treatment is further applied to the passivation layer 136. Fluorine has strong interaction with silicon of the passivation layer 136 by forming F—Si bonds), thereby reducing dangling bonds. As the passivation layer is thus enhanced and certain damage to the active regions is also reduced. In some examples, the F treatment is a fluorine plasma treatment. Particularly, fluorine plasma is generated and is introduced to the passivation layer 136 in a plasma chamber. In further examples, the fluorine dose of the fluorine treatment ranges from about $1 \times 10^{14}$ to about $2 \times 10^{15}$ ions/$cm^2$. Accordingly, thus formed passivation layer 136 a semiconductor layer (such as Si, SiC or SiGe as described above in various embodiments) has a fluorine concentration ranging from about $1 \times 10^{14}$ to about $2 \times 10^{15}$ $cm^{-2}$. Note that the F concentration is defined as a number of fluorine atoms per unit area in the present example. In other examples, the F treatment includes applies a bias voltage ranging from 0.5 keV to about 5 keV. In some examples, the F treatment is executed in the same apparatus used to form the passivation layer 136.

Figure 5A:
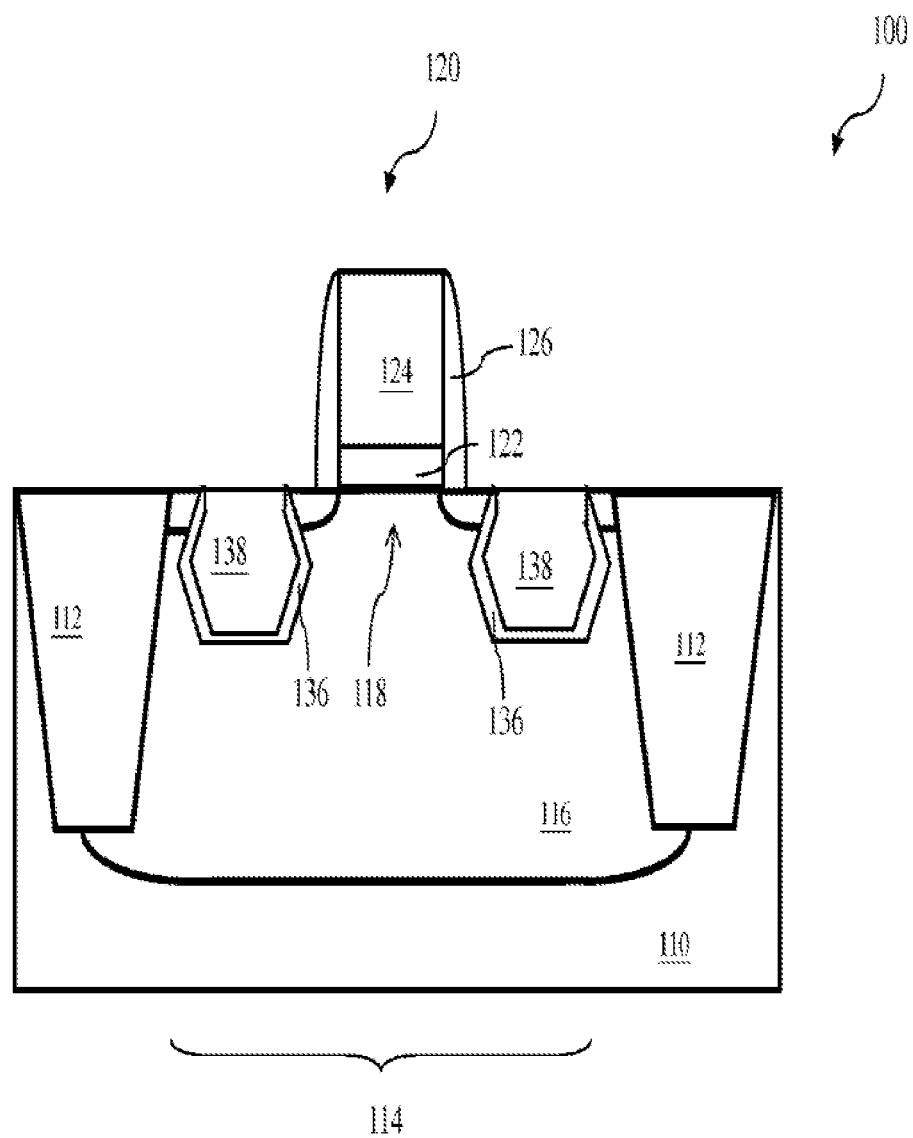

Referring to FIG. 5A, the recesses 132 are filled with a semiconductor material by a selective deposition process, thereby epitaxially growing source and drain (S/D) features 138 in crystalline structure. The deposition process to form the S/D features 138 involves chlorine for etching effect and makes the deposition selective. The selective deposition process is designed and tuned to epitaxially grow such that the S/D features 138 formed in the recesses 132 include the semiconductor material in a crystalline structure. The semiconductor material is different from that of the substrate 110. For example, the semiconductor material includes silicon carbide or silicon germanium while the substrate 110 is a silicon substrate. In some embodiments, the semiconductor material is chosen for proper strained effect in the channel region 118 such that the corresponding carrier mobility is increased. In one example, the active region 114 is for a pFET, the semiconductor material is silicon germanium doped with boron for S/D features 138 while the substrate 110 is a silicon substrate. In another example, the active region 114 is for an nFET, the semiconductor material is silicon carbide doped with phosphorous for S/D features 138 while the substrate 110 is a silicon substrate.

Figure 5B:
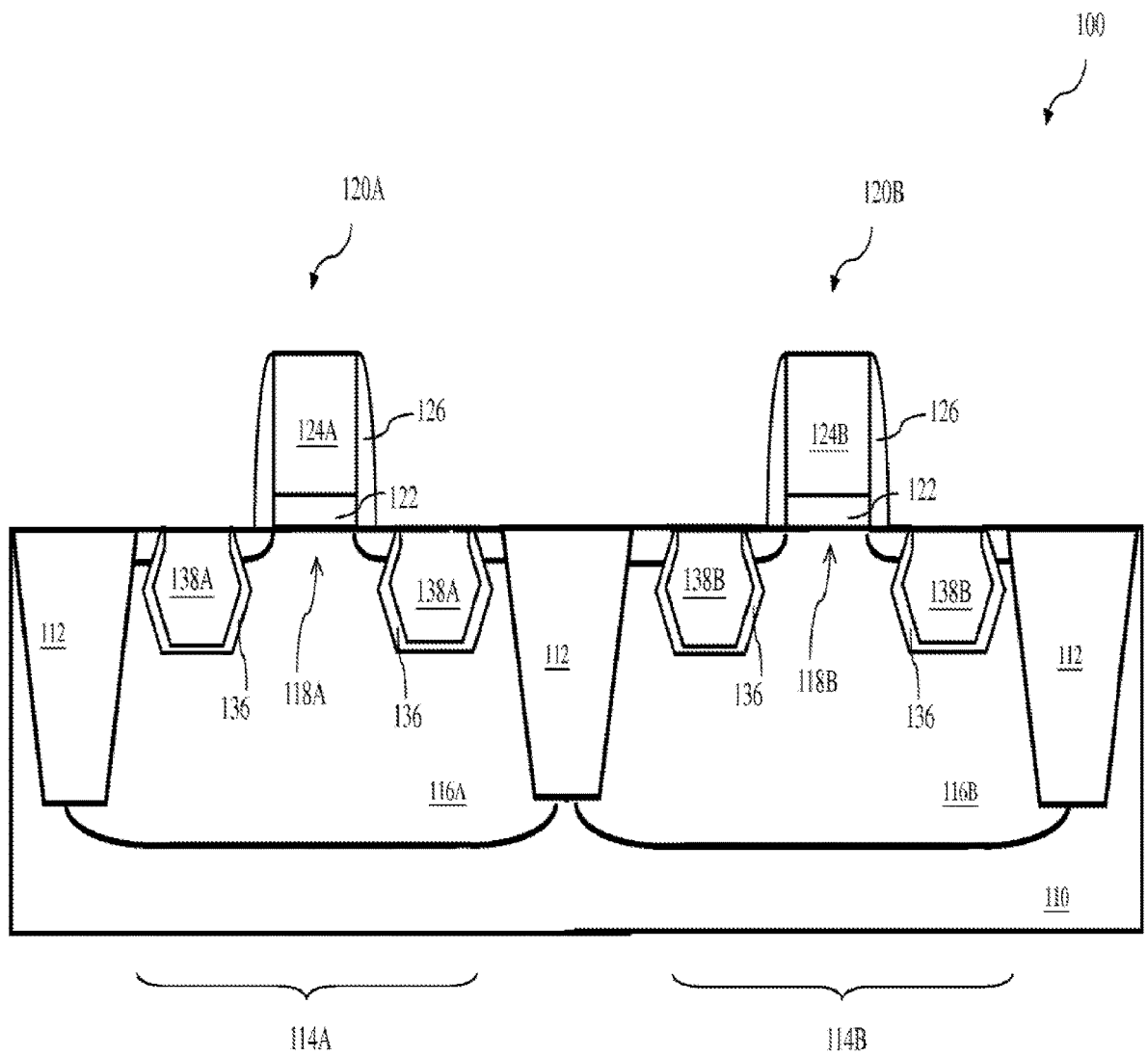

This is further illustrated in FIG. 5B in accordance with some embodiments. The semiconductor structure 100 includes the first active regions 114A for a nFET and the second active region 114B for a pFET. The semiconductor structure 100 further includes the p-type doped well 116A in the first active region 114A and the n-type doped well 116B in the second active region 114B for the pFET. The semiconductor structure 100 further includes the first gate stack 120A and the second gate stack 120B, disposed within the first and second active regions, respectively. Particularly, the S/D features 138A are silicon carbide doped with phosphorous (SiC—P), providing tensile stress to the channel region 118A of the nFET, according to one embodiment. In another embodiment, the S/D features 138B are silicon germanium doped with boron (SiGe—B), providing compressive stress to the channel region 118B of the pFET. In some other embodiments, the S/D features 138A of SiC—P and the S/D features 138B of SiGe—P are both present in the semiconductor structure 100 and are formed respectively by a suitable procedure. In one example, the procedure includes covering the first active region 114A using a first mask while epitaxially growing SiGe—B in the recesses of the second active region 114B and covering the second active region 114B using a second mask while epitaxially growing SiC—P in the recesses of the first active region 114A. The first and second masks may be patterned resist layers formed by lithography or alternatively hard masks formed by deposition and lithohraphy patterning. In yet other embodiments, the S/D features 138A are SiC—P while the S/D features 138B are silicon doped with boron (Si—B) or the S/D features 138A are silicon doped with phosphorous (Si—P) while the S/D features 138B are SiGe—B.

Still referring to FIG. 5B, while the S/D features 138A and 138B are different as described above, the passivation layer 136 is same to both active regions 114A and 114B in terms of composition and formation, in accordance with some embodiments, such as those in FIG. 4B. In one example, the passivation layer 136 includes a phosphorous-free SiC layer with a carbon concentration ranging from about 1.8% to about 3%. In furtherance of the example, the S/D features 138A include SiC—P (or Si—P) while the S/D features 138B may include SiGe—B (or Si—B). In another example, the passivation layer 136 includes a SiC—P layer with a phosphorous concentration less than $10^{-20}/cm^3$ and the S/D features 138A include SiC—P with a phosphorous concentration greater than $10^{-20}/cm^3$. In yet another example, the passivation layer 136 is a SiGe layer free of boron or other p-type dopant.

Still referring to FIG. 5B, the first gate electrode 124A and the second gate electrode 124B may be same in composition (such as polysilicon) or alternatively different (such as the first gate electrode 124A includes a n-type work function metal layer and the second gate electrode 124B includes a p-type work function metal layer), such as in a gate-first process to form metal gates.

The operation to form the S/D features is further described according to various embodiments. In some embodiments, the selective deposition process to form the S/D features 138 in the recesses 132 is a cyclic deposition and etching (CDE) process. The semiconductor material is epitaxially grown in the recesses 132. In the present embodiment, the S/D features 138 are in-situ doped during the CDE process with precursor that includes dopant-containing chemical. The CDE process is a two-cycle operation with a precursor having chlorine for deposition/etching effects so that the semiconductor material is selectively deposited in the recesses 132. In the first cycle (deposition cycle), the various chemicals are used as precursor to epitaxially grow the semiconductor material. In the second cycle (etching cycle), chlorine-containing gas (such as HCl, Cl2 or both) is used for etching. The CDE process repeats the two cycles until the recesses 132 are filled or alternatively overgrowing beyond the top surface of the substrate 110.

In some embodiments when an nFET is formed in the active region 114 in FIG. 5A (or 114A in FIG. 5B), the semiconductor material is silicon carbide with phosphorous (P) dopant. In furtherance of the embodiments, the precursor used in the first cycle (deposition cycle) of the CDE process includes $SiH_4$ (and/or $Si_2H_6$), $PH_3$, and MMS. The second cycle (etching cycle) includes HCl or $Cl_2$. In one example, the HCl is provided with a processing chamber pressure ranging from about 200 Torr to about 250 Torr.

In some other embodiments when a pFET is formed in the active region 114 in FIG. 5 (or 114B in FIG. 5B), the semiconductor material is silicon germanium with boron (B) dopant. In furtherance of the embodiments, the precursor used in the first cycle (deposition cycle) of the CDE process includes $SiH_4$ (and/or $Si_2H_6$), $B_2H_6$, and $GeH_4$. The second cycle (etching cycle) includes HCl or $Cl_2$. In one example, the HCl is provided with a processing chamber pressure ranging from about 200 Torr to about 250 Torr.

In some embodiments, the precursor used in the deposition cycle may alterantively includes other silicon-containing chemical, such as silane ($SiH_4$), disilane ($Si_2H_6$), trisilane ($Si_3H_8$), dichlorosilane ($SiH_2Cl_2$), another silicon-containing precursor, or a combination thereof.

In some embodiments, the operation to form the S/D features 138 may alternatively use other deposition technique, such as a deposition process that the deposition gas (chemicals for deposition) and etching gas (chlorine-containing gas, such as $Cl_2$ or HCl) are simultaneously flown to the processing chamber. Instead of two cycles, the operation is a continuous deposition/etching process that epitaxially grows the semiconductor material selectively in the recesses 132. Thus, the disclosed deposition of the semiconductor material to the recesses 132 is insensitive to the metal residuals, eliminating the metal assisted silicon etching issue and the associated defects. The deposition process is referred to as selective epitaxy growth (SEG) with co-flow deposition & etches chemicals, or simply referred to as co-flow epitaxy growth (or co-flow epitaxy deposition).

In some embodiments, the S/D features may be formed by a combination of CDE and co-flow epitaxy growth. The S/D features 138A may include SiC—P with graded phosphorous concentration formed by two or more steps of CDE and co-flow eptaxy growth. For example, the the S/D features 138A incudes first SiC—P layer; a second SiC—P layer on the first SiC—P layer; and a third SiC—P layer on the second SiC—P layer with respective dopant concentrations. In a particular example, the S/D features 138A include the first SiC—P layer with a first phosphorous concentration ranging from about $10^{20}/cm^3$ to about $4\times10^{20}/cm^3$ formed by a CDE process with in-situ doping; the second SiC—P layer with a second phosphorous concentration ranging from about $4\times10^{20}/cm^3$ to about $10^{21}/cm^3$ formed by a co-flow epitaxy growth with in-situ doping; and the third SiC—P layer with a third phosphorous concentration ranging from about $10^{21}/cm^3$ to about $3\times10^{21}/cm^3$ formed by another co-flow epitaxy growth with in-situ doping. In furtherance of the example, the first, second and third SiC—P layers have thicknesses 10 nm-20 nm; 10 nm 20 nm; and 5 nm 15 nm, respectively.

Figure 6:
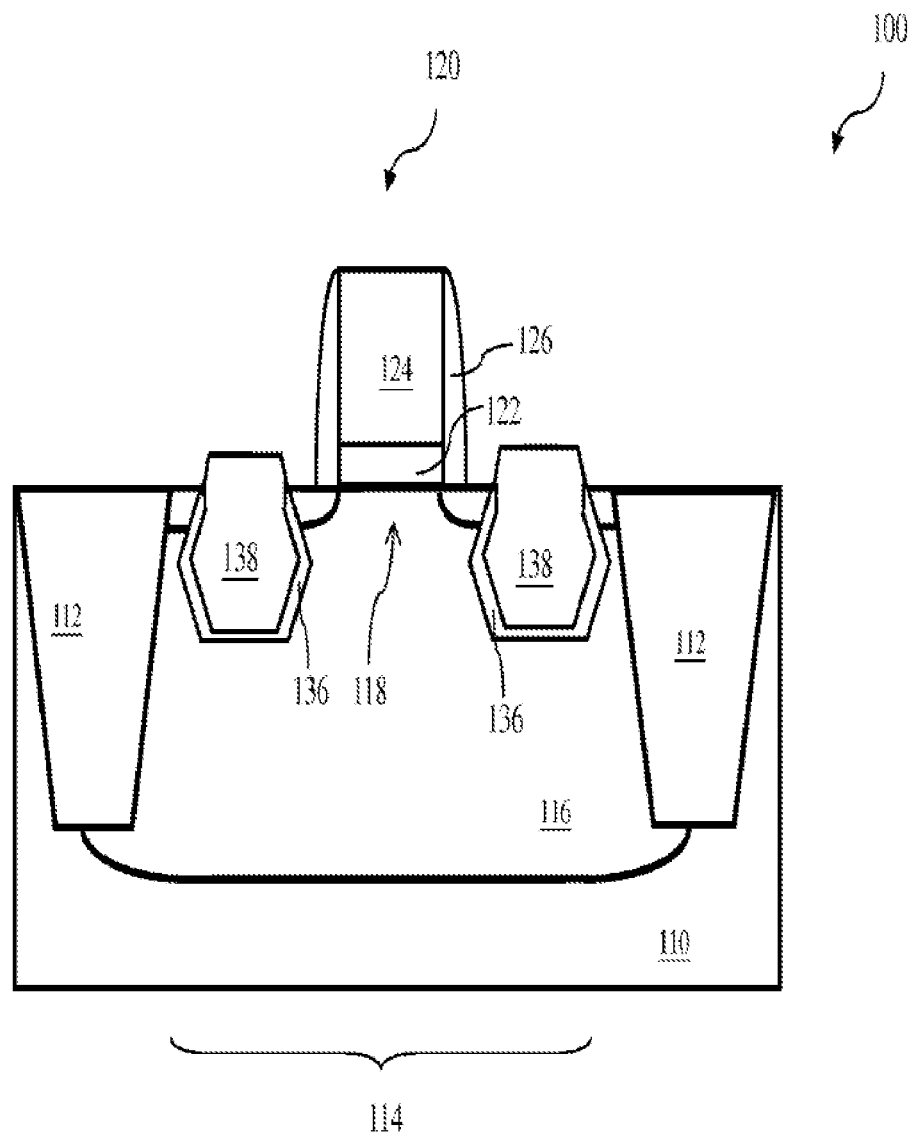
FIG. 6 is a sectional view of a semiconductor structure constructed according to other embodiments.

In some embodiments, the S/D features 138 are formed in the recesses 132 such that the recesses 132 are substantially filled with a top surface substantially coplanar to the substrate 110 (particularly, coplanar with the top surface of the channel region 118, such as illustrated in FIG. 5A or FIG. 5B. The S/D features 138 may have other alternatives in terms of composition, geometry and formation. As illustrated in FIG. 6, the S/D features 138 are over grown in the recesses 132 beyond the top surface of the channel region 118.

The semiconductor structure 100 may include other features formed by corresponding operations. In one embodiment, an interlayer dielectric (ILD) layer is formed by a deposition technique, such as chemical vapor deposition CVD and CMP. In another embodiment, an interconnect structure is formed and include various conductive features (such as metal lines, contact features and via features) configured to couple various devices to form a functional circuit.

In other embodiments, the gate stack 120 is a dummy gate and is replaced by a gate stack having metal electrode and high-k dielectric in a gate replacement procedure, such as a gate-last process or a high-k last process. In a gate-last process, an interlayer dielectric (ILD) material layer is formed on the substrate and surrounding the gate stack 120, by deposition and polishing (e.g., CMP). The gate electrode in the dummy gate is removed by selective etching, resulting in a gate trench in the ILD. Thereafter, a final gate stack is formed in the gate trench of the ILD by a suitable procedure, such as deposition and CMP. A high-k-last process is similar to the gate-last process but the gate dielectric of the dummy gate is treated differently. In the high-k-last process, the dummy gate stack (including both gate dielectric and gate electrode) is removed after the ILD formation. Thereafter, a final gate stack is formed in the gate trench of the ILD.

Figure 7:
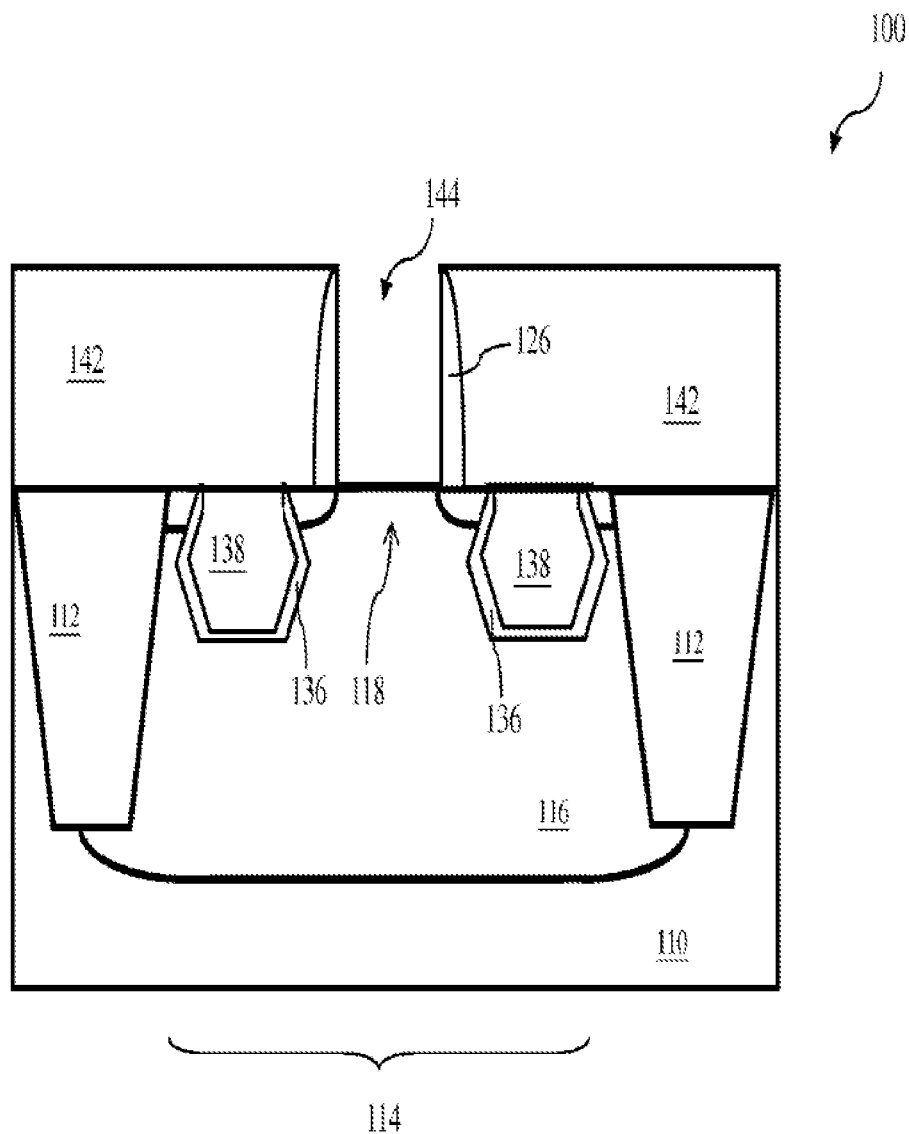
Figure 8A:
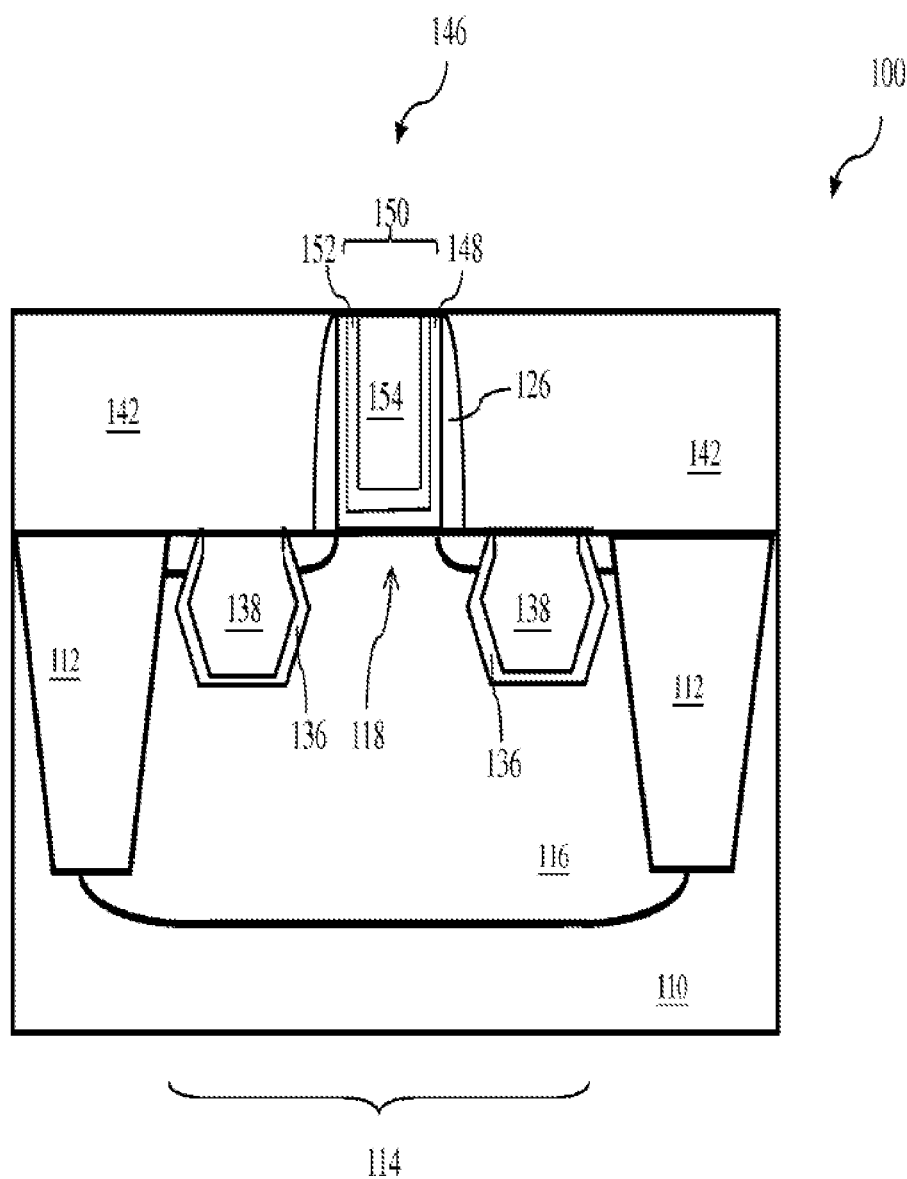

One embodiment of the gate replacement is provided in FIGS. 7 and 8A for illustration. An ILD layer 142 is formed on the substrate 110 and surrounding the dummy gate stack 120, by deposition and polishing (e.g., CMP). The ILD material layer 142 includes one or more dielectric m materials, such as silicon oxide, fluorinated silica glass (FSG), low-k dielectric material or other suitable dielectric material. The deposition may include CVD or plasma-enhanced CVD or other suitable deposition technique. The dummy gate stack 120 is removed by selective etching, resulting in a gate trench 144 in the ILD material layer 142. Thereafter, a gate stack 146 of high k dielectric and metal electrode is formed in the gate trench 144 by a suitable procedure that includes deposition and CMP. Thus formed gate 146 includes gate dielectric 148 and metal gate electrode 150. In a particular example, the gate dielectric 148 includes an interfacial layer of silicon oxide and a high-k dielectric layer on the interfacial layer.

The metal gate electrode 150 includes a metal layer 152 has a proper work function (a metal with a work function less than about 4.2 eV for nFET or greater than about 5.2 eV for pFET), such as tantalum for nFET and titanium nitride for pFET. The metal layer 152 is also referred to as work function (WF) layer, or particularly n-type WF layer or p-type WF layer. The gate electrode 150 may include multiple conductive layers. For example, the gate electrode 150 includes the WF layer 152 on the gate dielectric feature 148 and a conductive layer 154 on the WF layer 152. In one example, the WF layer 152 includes tantalum or titanium nitride. In another example, the conductive layer 154 includes aluminum, tungsten, copper, doped polysilicon or a combination thereof. When the gate stack 146 is formed by a high-k last process, the gate dielectric layer 148 is formed on bottom and sidewalls of the gate trench 144, or is U-shaped in other words.

Thus formed semiconductor structure 100 includes a gate stack, epiaxially grown S/D features of a semiconductor material different from that of the substrate; and a passivation layer disposed surrounding the S/D features and separating the S/D features from the substrate. The passivation layer effectively prevents the metal residual from direct contact with the Cl-containing chemical during the operations to form the S/D features, thereby eliminating the defects associated with the interaction between Cl and the metal residuals.

Figure 8B:
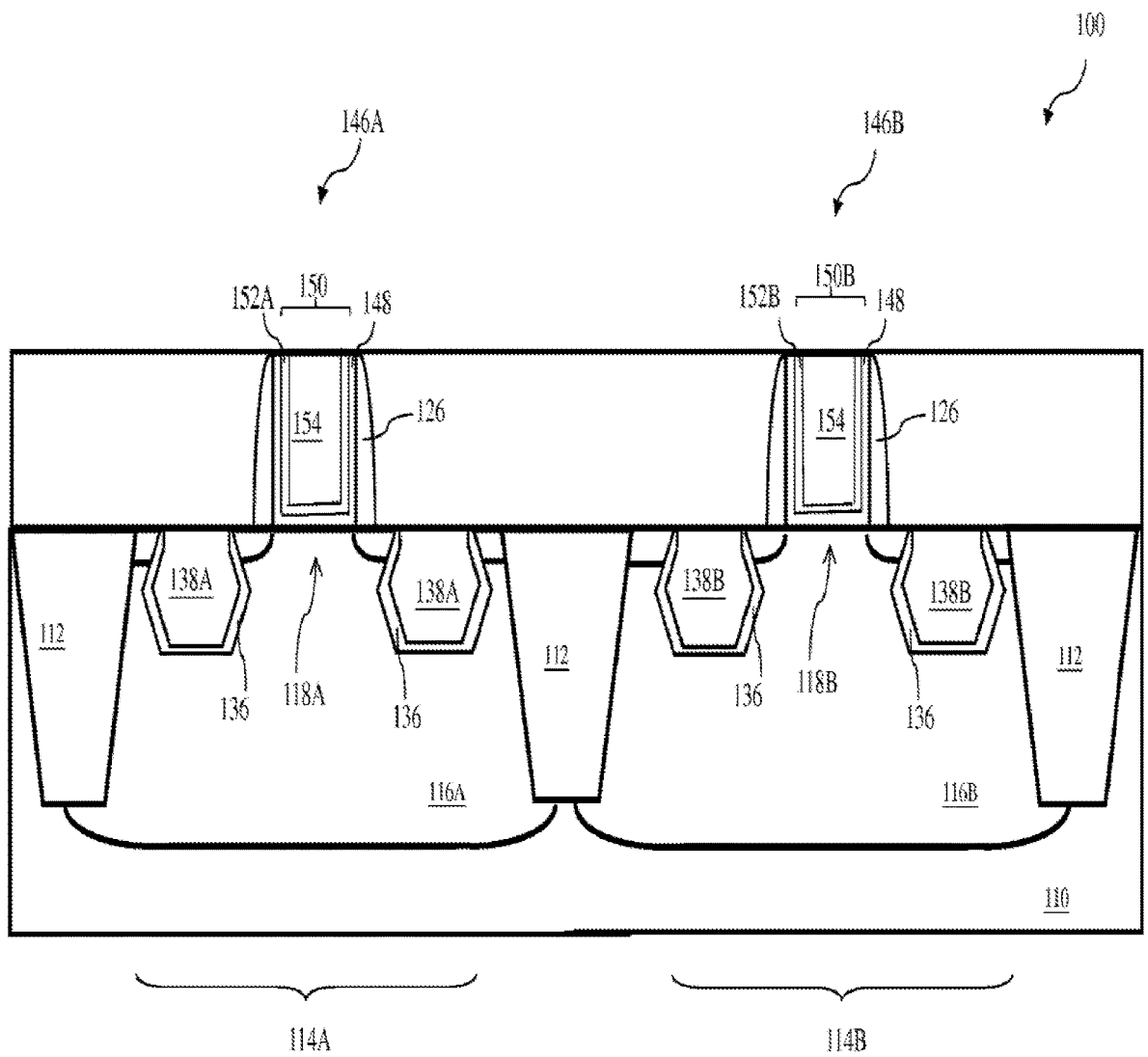

FIG. 8B illustrates a sectional view of the semiconductor structure 100 that includes a first FET of a first conductivity and a second FET of second conductivity opposite to the first conductivity. The first conductivity is one of a n-type conductivity and a p-type conductivity and the second conductivity is another one. For example, the first and second FETs are nFET and pFET, respectively. The semiconductor structure 100 in FIG. 8B includes a first metal gate stack 146A disposed on the first active region 114A for nFET and a second metal gate stack 146B disposed on the second active region 114B for pFET. The first metal gate stack 146A and the second metal gate stack 146B are both metal gate stacks formed by high-k last process. In the present embodiment, the first metal gate stack 146A and the second metal gate stack 146B are different from each other in composition. Particularly, the first metal gate stack 146A includes a n-type WF layer 152A having a work function less than about 4.2 eV (such tantalum) and a p-type WF layer 152B having a work function greater than about 5.2 eV (such as tantalum nitride). In one example of a procedure to form the metal gate stacks, the first gate stack 146A is formed within the first active region 114A while the second active region 114B is covered by a mask (such as a patterned resist layer or a patterned hard mask layer), and the second gate stack 146B is formed within the second active region 114B while the first active region 114A is covered by another mask.

Figure 9:
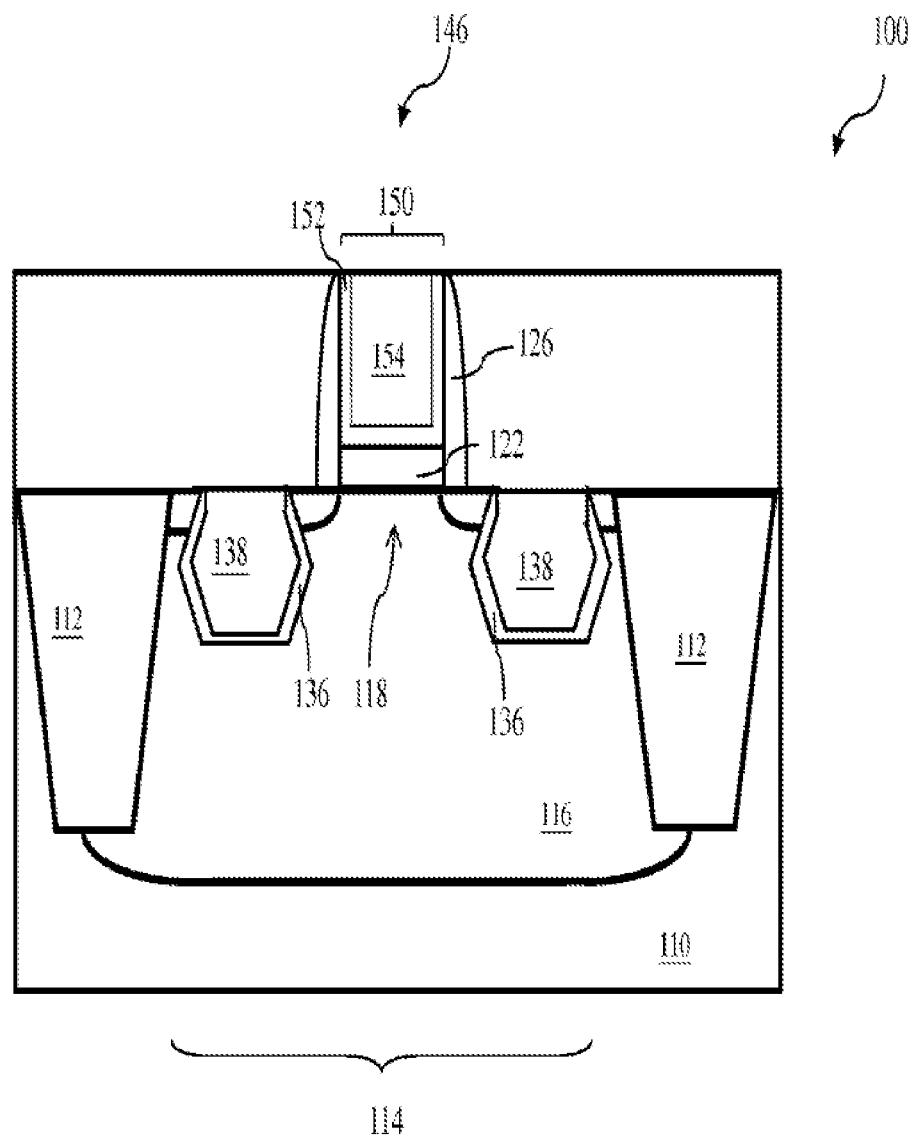
FIG. 9 is a sectional view of a semiconductor structure constructed according to other embodiments.

FIG. 9 illustrates a sectional view of the semiconductor structure 100 in accordance with other embodiments. The semiconductor structure 100 in FIG. 9 is similar to that in FIG. 8A except for that the metal gate stack 146 is formed by a gate last process. Particularly, the gate dielectric layer 120 is formed before the formation of the ILD layer 142 and therefore is not formed on the sidewalls of the gate trench 144.

Figure 10:
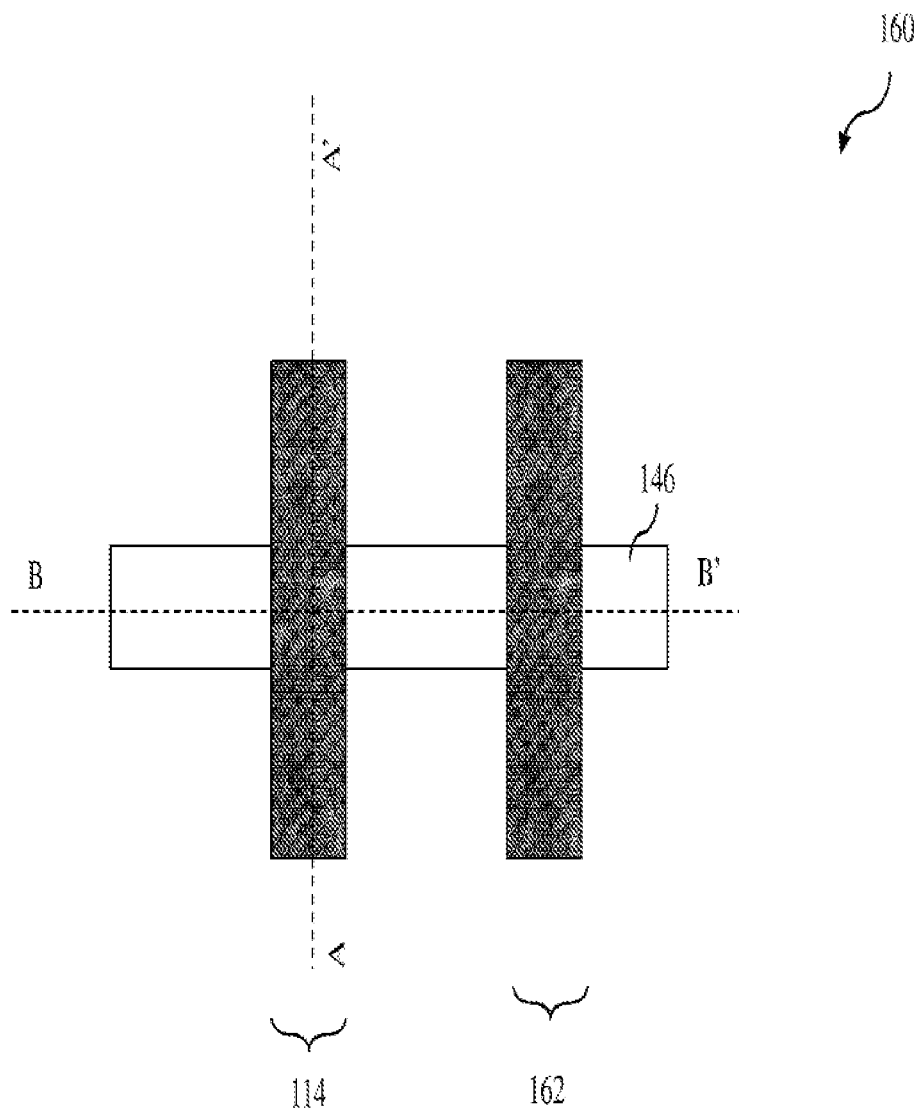
FIG. 10 is a top view of a semiconductor structure constructed in accordance with some embodiments.
Figure 11:
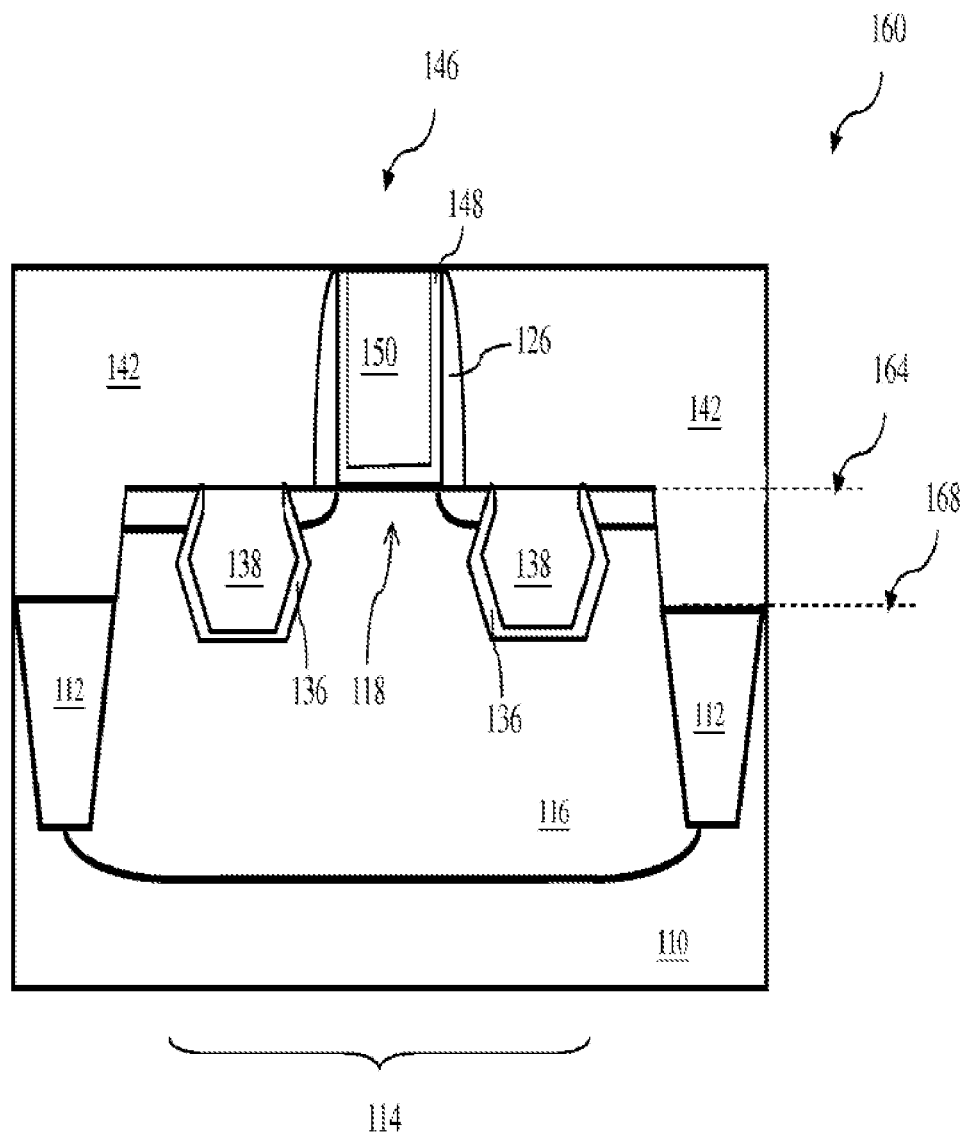
FIGS. 11-12 are sectional views of the semiconductor structure of FIG. 10 constructed in accordance with some embodiments.
Figure 12:
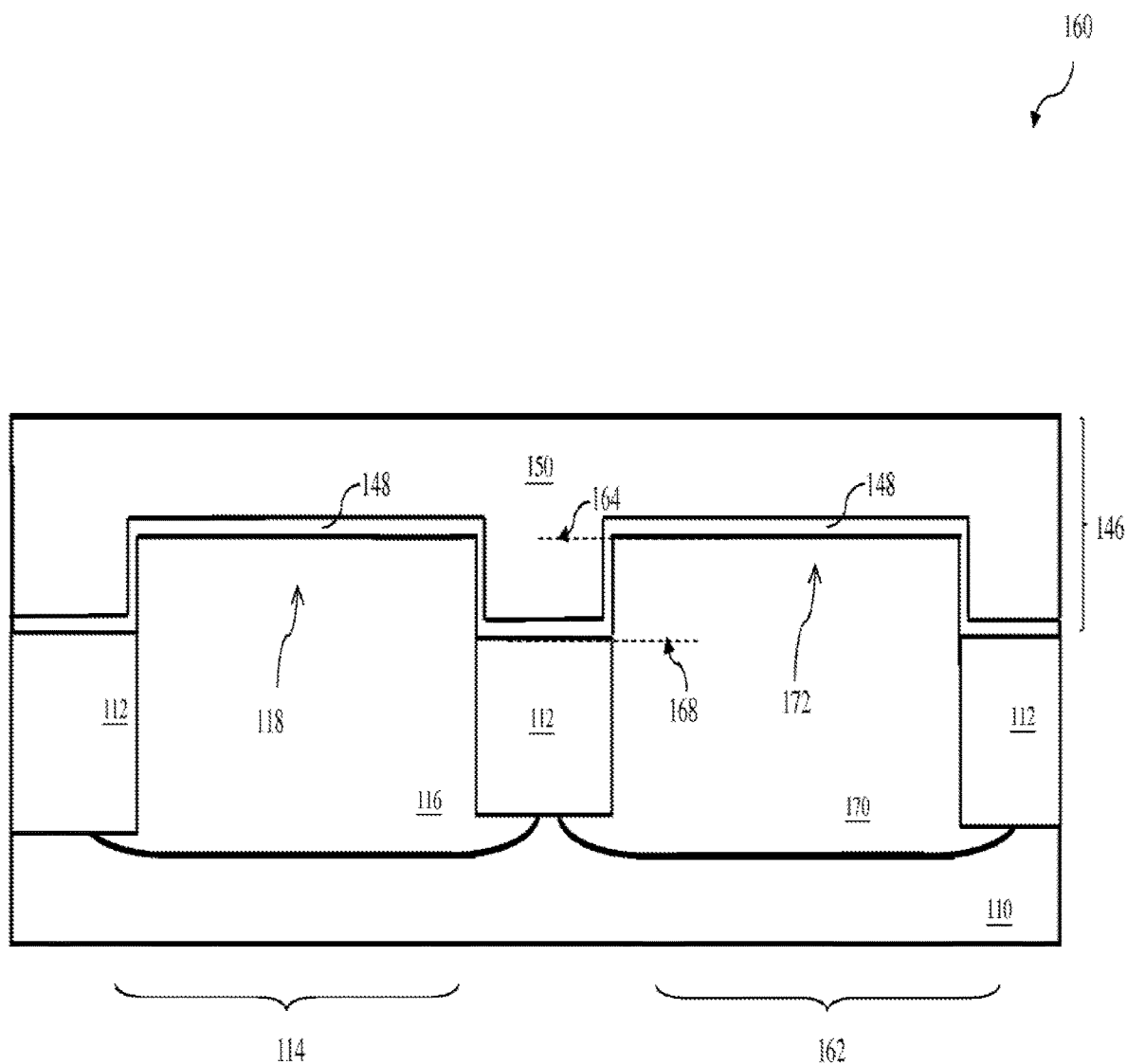

As noted above, the described semiconductor structure 100 may be formed on a planar substrate or alternatively on a non-planar substrate, such as a substrate having fin-like active region(s). FIGS. 10-12 illustrate the semiconductor structure 160 having fin-like active regions, constructed according to various aspects of the present disclosure in some embodiments. FIG. 10 is a top view of the semiconductor structure 160. FIG. 11 is a sectional view of the semiconductor structure 160 along the dashed line AA' and FIG. 12 is a sectional view of the semiconductor structure 160 along the dashed line BB'. The semiconductor structure 160 includes a first fin-like active region 114 and a second fin-like active region 162 separated isolation features 112, such as STI features. The semiconductor structure 160 further includes a gate stack 146 formed over the first and second fin-like active regions.

For a fin-like active region, the top surface 164 of the semiconductor substrate 110 (specifically the top surface of the channel region 118) and the top surfaces 168 of the STI features 112 are not coplanar, resulting in a three-dimensional structure. A FET formed on a fin-like active region is also referred to as a fin FET (FinFET). As illustrated in FIG.

11, the active region 114 is extruded above the top surface 168 of the STI features 112. The fin-like active regions are formed by a suitable technique, such as etching or epitaxy growth. In one example, after the formation of STI features 112, an etching process, such as wet etching, is applied to selectively etch the STI such that the STI features 112 are recessed. In another example, after the formation of STI features 112, a selective epitaxy growth process is applied to epitaxially grow a semiconductor material on the semiconductor substrate 110 such that the active region 114 is extended vertically above the top surface of the STI features 112. The semiconductor material of the fin active regions may be same to that of the semiconductor substrate, such as silicon, or alternatively different from that of the semiconductor substrate, such as silicon germanium. As illustrated in FIG. 12, the second fin active region 162 includes a doped well 170 and a channel region 172 formed in the doped well channel region. The gate stack 146 includes gate dielectric 148 and a gate electrode 150 formed by any proper procedure, such as gate-last process or high-k last process. Even though the fin-like active regions are illustrated in FIGS. 10-12, various embodiments of the semiconductor structure 100 illustrated in FIG. 1A through 9 may also embrace a fin structure having fin-like active region(s) and FinFET(s).

Figure 13:
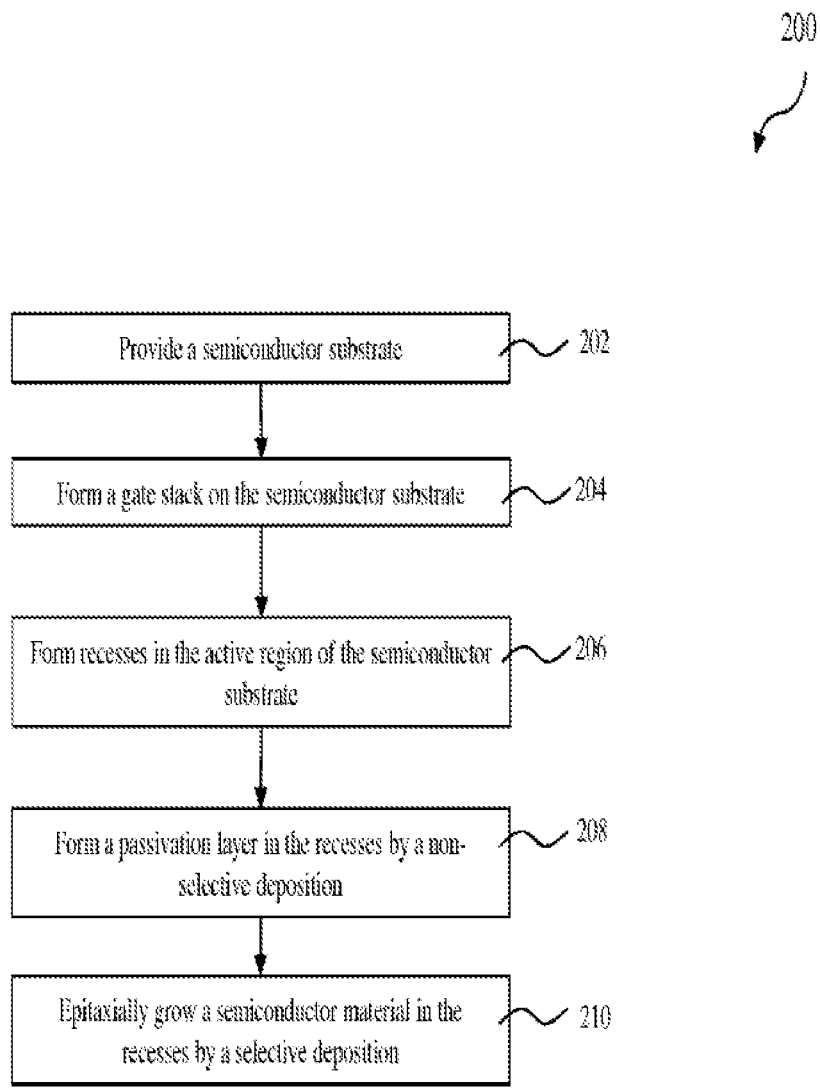
FIG. 13 is a flowchart of a method making a semiconductor structure constructed according to various aspects of the present disclosure in some embodiments.

FIG. 13 is a flowchart of a method 200 to form a semiconductor structure (such as 100 or 160) constructed according to various aspects of the present disclosure in some embodiments. The method 200 is described with reference to FIG. 8 and other figures. However, the semiconductor structure 100 is provided as an example and is not intended to limit the scope of the method. The method 200 includes a block 202 by providing a semiconductor substrate 110, such as a silicon wafer. The semiconductor substrate 110 may further include other features/components, such as doped well 116 and STI 112.

The method 200 also includes an operation 204 to form gate stack 120. The formation of the gate stack includes various depositions and patterning. Other features, such as gate spacers 126 and LDD features 128 may be further formed.

The method 200 includes an operation 206 by forming recesses 132. The recesses 132 are formed in the semiconductor substrate within the active region 114 by an operation that includes etching. In some embodiments, the recesses 132 may be formed using, such as a wet (and/or dry) etch process selective to the material of the substrate 110. A cleaning process may follow the etching process using a suitable chemical. The etching and/or cleaning processes may introduce metal residuals to the recesses 132.

The method 200 includes an operation 208 by forming a passivation layer 136. The passivation material layer 136 is formed to cover the substrate 110 and is designed with composition and thickness to effectively isolate the metal residuals from the chlorine chemical during the subsequent operations, thereby eliminating the metal assisted silicon etching and eliminating the formation of the associated defects. In some embodiments, the passivation layer 136 includes carbon, germanium, silicon carbide or silicon germanium, such as those described in FIG. 4A. The passivation layer 136 is epitaxially grown on the substrate 110 and is formed by a non-selective epitaxy growth using a chlorine-free precursor. Note that the passivation layer 136 may be formed on other regions (such as on STI features and/or on gate stack) with non-crystalline structure but those portions of the passivation layer 136 will eventually be removed, such as during the next operation 210. Thus, the passivation layer 136 within the recesses 132 is in crystalline structure so that the subsequent operations can epitaxially grow and fill the recesses 132 to from S/D features in crystalline structure. During the formation of the passivation layer 136, the precursor is free of chlorine (Cl) to avoid direct reaction between Cl and the metal residuals. Since the precursor is free of Cl, the deposition is nonselective and may also be formed on other regions, such as on the gate stack and STI features. In some examples, the passivation layer 136 includes silicon or silicon carbide formed by a deposition with precursor free of Cl. In some embodiments, the passivation layer 136 has a thickness ranging from about 1 nm to about 4 nm.

In one embodiment, the passivation layer 136 is a silicon carbide layer formed by epitaxially growing a silicon carbide layer using a precursor free of Cl. In furtherance of the embodiment, the precursor includes monomethylsilane ($CH_3SiH_3$ or MMS) and $SiH_4$. The passivation layer 136 may include a mono layer or multiple layers. In the present example, the precursor is further free of dopant (such as free of phosphorous) to prevent dopant diffusion. In this case, the passivation layer 136 is free of chlorine and dopant. In some embodiments, the precursor is tuned (by controlling gas flows for examples) to form a SiC layer.

In alternative embodiment, the passivation layer 136 is a silicon layer formed by epitaxially growing a silicon layer using a precursor free of Cl. In furtherance of the embodiment, the precursor includes $SiH_4$. The passivation layer may include a mono layer or multiple layers. In the present embodiment, the precursor includes no dopant (such as phosphorous or boron-containing chemical) to prevent dopant diffusion. In some other embodiments, the passivation layer 136 may include is a germanium layer or a silicon germanium layer.

The method 200 includes an operation 210 to form S/D feature 138 by epitaxial growing in the recesses 132 with a semiconductor material different from that of the substrate 110 for strain effect. The operation 210 involves chlorine for etching effect and therefore is selective. The deposition occurs on the substrate 110 and also on other regions (such as STI and gate stacks) with different deposition rates and structures. The chlorine-containing gas provides etching effect such that the semiconductor material deposited on the other regions (such as on STI features and/or gate stack) is completely removed, making the operation 210 a selective deposition. The semiconductor material deposited in the recesses 132 is crystalline since the passivation layer 136 is crystalline and serves as a seed layer for epitaxy growth.

In some embodiments, the operation 210 includes a CDE process. The recesses 132 are filled with the semiconductor material by a CDE process, thereby forming S/D features 138. The semiconductor material is different from that of the substrate 110. For example, the semiconductor material includes silicon carbide or silicon germanium while the substrate 110 is a silicon substrate. In the present embodiment, the source and drain features 138 are in-situ doped during the CDE process during the CDE process with precursor that includes dopant-containing chemical. The CDE process is a two cycle operation. In the first cycle for deposition, various chemicals are used as precursor to epitaxially grow the semiconductor material. In the second cycle, a chlorine-containing gas (such as HCl, $Cl_2$ or both) is used for etching. The CDE process repeats the two cycles until the recesses 132 are filled or alternatively overgrowing beyond the top surface of the substrate 110.

In some embodiments when an nFET is formed in the active region 114, the semiconductor material is silicon carbide with phosphorous (P) dopant. In furtherance of the embodiments, the precursor used in the first cycle (deposition cycle) of the CDE process includes $SiH_4$ (and/or $Si_2H_6$), $PH_3$, and MMS. The second cycle (etching cycle) includes HCl or $Cl_2$. In one example, the HCl is provided with a processing chamber pressure ranging from about 200 Torr to about 250 Torr.

In some other embodiments when a pFET is formed in the active region 114, the semiconductor material is silicon germanium with boron (B) dopant. In furtherance of the embodiments, the precursor used in the first cycle (deposition cycle) of the CDE process includes $SiH_4$ (and/or $Si_2H_6$), $B_2H_6$, and $GeH_4$. The second cycle (etching cycle) includes HCl or $Cl_2$. In one example, the HCl is provided with a processing chamber pressure ranging from about 200 Torr to about 250 Torr.

In some embodiments, the precursor used in the deposition cycle includes silane, disilane, trisilane, Dichlorosilane ($SiH_2Cl_2$), another silicon-containing precursor, and/or any combinations thereof.

In some embodiments, the operation 210 may use a co-low deposition process. In the co-flow epitaxy growth, the chemicals for deposition and chlorine-containing gas are simultaneously flown to the processing chamber for continuous and simultaneous deposition/etching effect. The chemicals for deposition and the chlorine-containing gas are similar to those used in the CDE process.

Other fabrication steps may be implemented before, during and after the operations of the method. In one embodiment, an inter-level dielectric (ILD) layer is formed on the semiconductor substrate. The ILD layer includes silicon oxide, low k dielectric material, other suitable dielectric materials, or combinations thereof. The ILD layer is formed by a suitable technique, such as CVD. For example, high density plasma CVD may be implemented to form the ILD layer.

In another embodiment, the method further includes a procedure to form various interconnection features designed to couple various devices to form a functional circuit. The interconnection features include vertical interconnects, such as contacts and vias, and horizontal interconnects, such as metal lines. The various interconnection features may use various conductive materials including copper, tungsten and silicide. In one example, a damascene process is used to form copper-based multilayer interconnection structure. In another embodiment, tungsten is used to form tungsten plug in the contact holes. In another example, silicide is used to form various contact on source and drain regions for reduced contact resistance.

Figure 14:
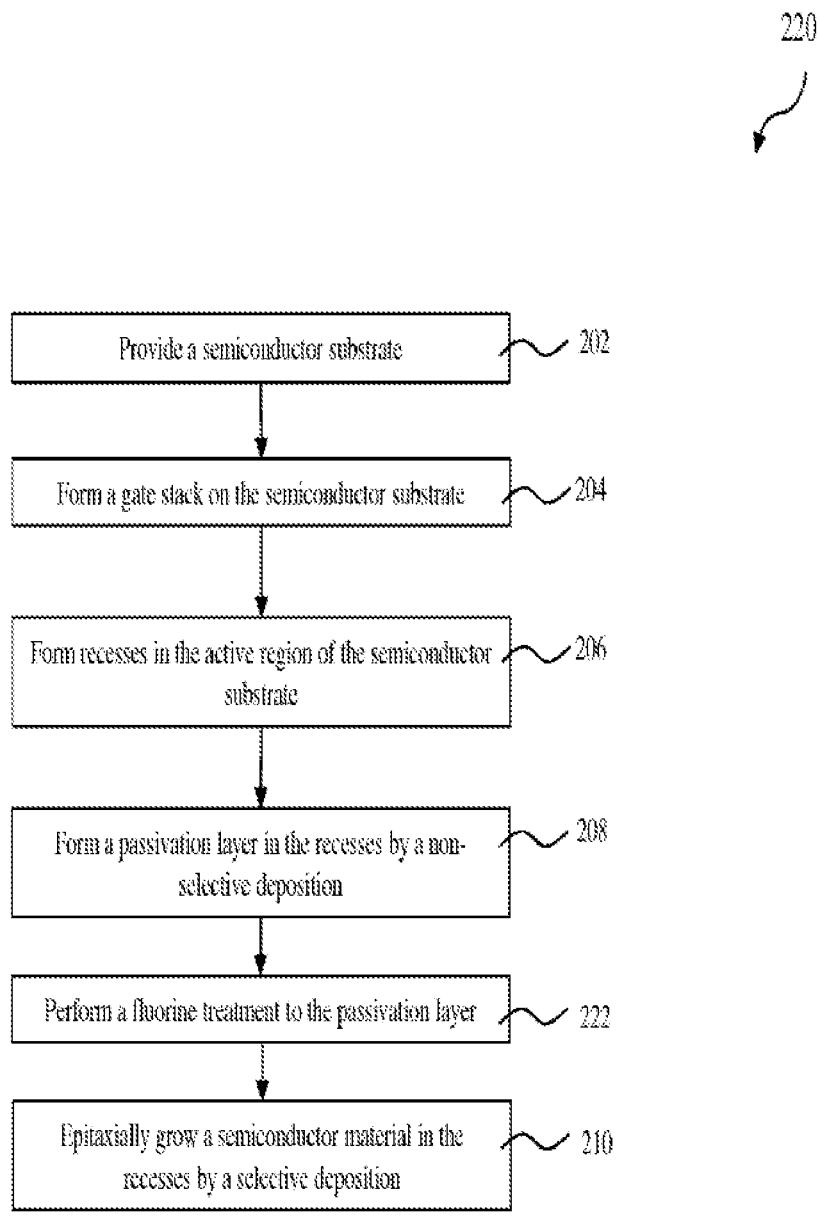
FIG. 14 is a flowchart of a method making a semiconductor structure constructed according to various aspects of the present disclosure in some other embodiments.

FIG. 14 is a flowchart of a method 220 to form a semiconductor structure constructed according to various aspects of the present disclosure in some other embodiments. The method 220 is similar to the method 200. However, the method 220 further includes an operation 222 implemented between the operations 208 and 210. The operation 222 includes applying a fluorine treatment process to the passivation layer 136. In some embodiments, the F treatment is a fluorine plasma treatment. Particularly, fluorine plasma is generated in a plasma chamber and is introduced to the passivation layer 136. In further examples, the fluorine dose of the fluorine treatment ranges from about $1 \times 10^{14}$ to $2 \times 10^{15}$ ions/cm$^2$. Accordingly, thus formed passivation layer 136 a semiconductor layer (such as Si, SiC or SiGe as described above in various embodiments) has a fluorine concentration ranging from about $1 \times 10^{14}$ to $2 \times 10^{15}$ cm$^2$. In other examples, the F treatment includes applies a bias voltage ranging from 0.5 keV to about 5 keV. In some examples, the F treatment is executed in the same apparatus used to form the passivation layer 136. Fluorine has a strong interaction with silicon and forms F—Si bonds, reduces the dangling bonds, and therefore reducing/eliminating subsequent damages to the substrate, particularly the portions underlying the passivation layer 136. After the F treatment to the passivation layer 136, the method 220 proceeds to the operation 210 by epitaxially growing a semiconductor material in the recesses 132.

Figure 15:
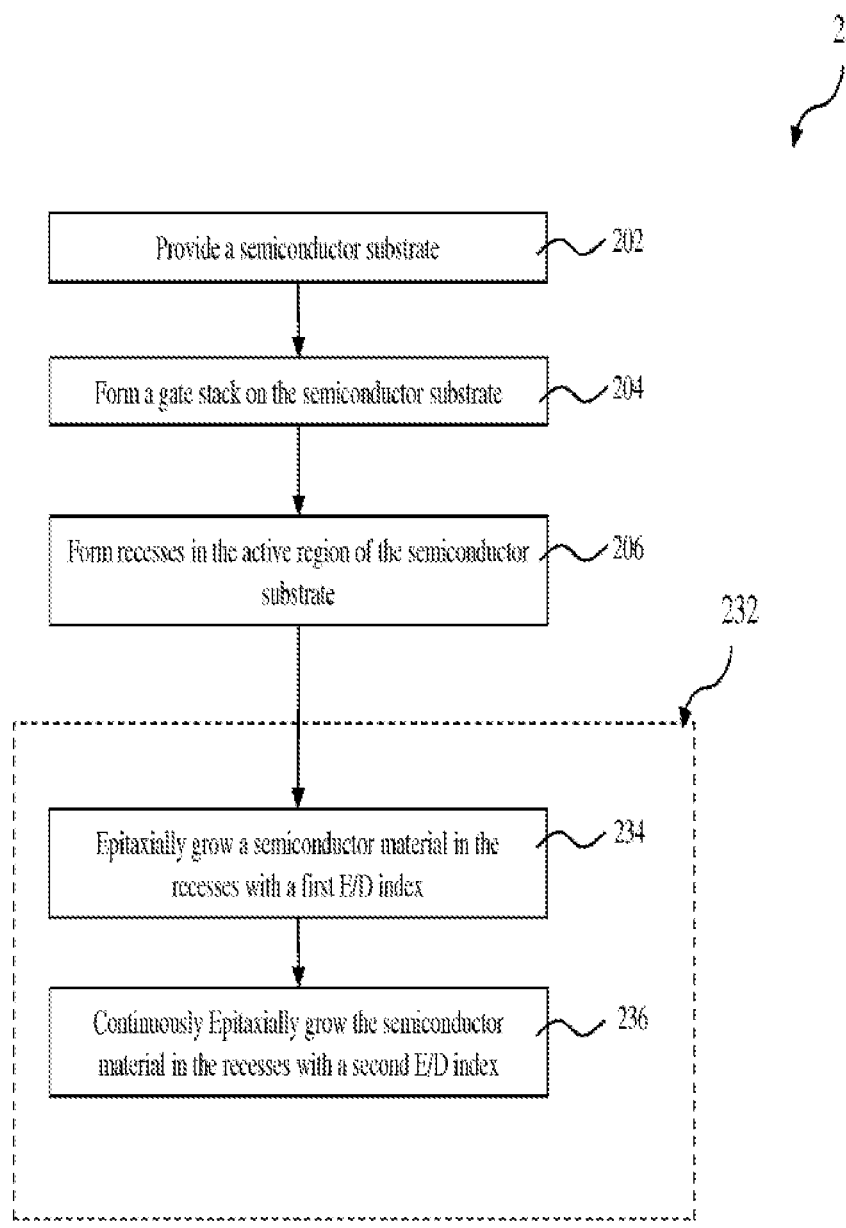
FIG. 15 is a flowchart of a method making a semiconductor structure constructed according to various aspects of the present disclosure in some other embodiments.
Figure 16:
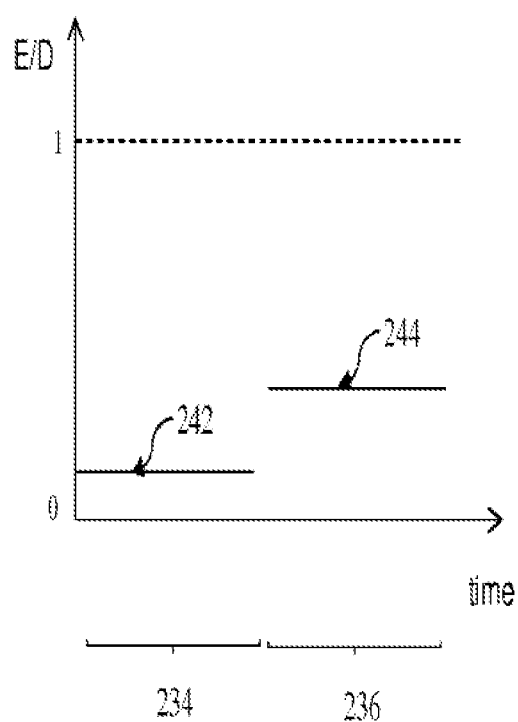
FIG. 16 illustrates a deposition process in the method of FIG. 15 and the corresponding E/D factor in accordance with some embodiments.

FIG. 15 is a flowchart of a method 230 to form a semiconductor structure constructed according to various aspects of the present disclosure in some other embodiments. The method 230 is designed to form epitaxy grown S/D features while the metal assisted silicon etching effect and the associated defects are eliminated or substantially reduced. The method 230 includes blocks 202-206 similar to those of the method 200.

After the formation of the recesses 132 in the substrate 110 by the operation 206, the method 230 proceeds to an operation 232 to form the S/D features 138 in the recesses 132. The operation 232 includes an epitaxy deposition with a varying etching/deposition factor. Particularly, the operation 232 epitaxially grows a semiconductor material in the recesses 132 with both deposition and etching effects. During the operation 232, a chlorine-containing gas (such as $Cl_2$ or HCl) is introduced into the processing chamber for etching effect, thus making the epitaxy deposition selective (selectively growing on a substrate 110). In various embodiments, the operation 232 includes a CDE process, a co-flow epitaxy growth, or a combination thereof. Various aspects of the CDE and co-flow epitaxy growth are described above and are not repeated here. An etching/deposition (E/D) factor is introduced and defined to characterize the epitaxy deposition 232. The E/D factor is defined as a ratio of the etch amount over the deposition amount to the semiconductor substrate during a certain process time. The E/D factor ranges from 0 to a value less than 1. The epitaxy deposition 232 is implemented in a way such that the E/D factor varies over the epitaxy deposition process, particularly increases over the process. The epitaxy deposition 232 and the E/D factor are further described below in accordance with some embodiments.

As described above with the method 200, a CDE process includes a deposition cycle (or D cycle) and an etching cycle (or E cycle) repeated multiple times. The E/D factor is variable by varying one or more parameters, such as processing temperature, gas flow, gas partial pressure, E cycle duration, D cycle duration, a ratio of E cycles over D cycles, or a combination thereof. In one embodiment, the duration of D cycle and the duration of E cycles (or a ratio of D duration over E duration) are tuned to vary the E/D factor. As an example for illustration, a CDE process may have 15 second deposition and then 10 second etching for one E/D factor, or have 10 second deposition and then 6 second etching for another E/D factor. In another embodiment, the number of E cycles and the number D cycles (or a ratio of E cycles over D cycles) are tuned to vary the E/F factor. As an example for illustration, a CDE process may have 2 deposition cycles and 1 etching cycle for one E/D factor, or have 1 deposition cycle and 1 etching cycle for another E/D factor. In another embodiment, the substrate temperature is varied to vary the E/D factor. In an example for illustration, during an etching cycle of the CDE process, the substrate temperature is decreased to reduce the etching effect, therefore decreasing the E/D factor. In another embodiment, the E/D factor is tuned by reducing the deposition gas pressure (or deposition gas flow rate) to increase the E/D factor. In yet another embodiment, the E/D factor is tuned by reducing the etching gas pressure (or etching gas flow rate) to decrease the E/D factor.

In a co-flow epitaxy growth, the E/D factor is varied similarly. In one embodiment, the substrate temperature is varied to vary the E/D factor. For example, the etching effect is apparent only when the substrate temperature is at or greater than 620° C. When the substrate temperature is increased to above 620° C., thereby increasing the etching effect, therefore increasing the E/D factor. In another embodiment, the E/D factor is tuned by reducing the deposition gas partial pressure (or deposition gas flow rate) to increase the E/D factor. In yet another embodiment, the E/D factor is tuned by reducing the etching gas partial pressure (or etching gas flow rate) to decrease the E/D factor.

In the operation 210 of the method 200, the E/D factor in the corresponding CDE process or co-flow epitaxy growth is a constant over the process. In the operation 232, the E/D factor is a varying parameter that increases over the process. Initially, the E/D factor is less enough such that the metal assisted silicon etching is eliminated or substantially reduced. Then, the E/D factor is increased over the process time, thereby making the epitaxy process 232 selective.

In some embodiments, the epitaxy deposition process in the operation 232 includes a first deposition step 234 having a first E/D factor and a second deposition step 236 having a second E/D factor. It is further illustrated in FIG. 15. At the first deposition step 234, the epitaxy deposition process is controlled to have the first E/D factor 242 that is chosen to substantially reduce the chlorine and reduces the interaction between the chlorine and the metal residuals. The first E/D factor 242 ranges from zero to about 0.2 in some examples. The first deposition step 234 is not selective. At the second deposition step 236, the second E/D factor 244 is tuned such that the epitaxy deposition process selectively deposits on the substrate 110. The second E/D factor 244 is greater than the first E/D factor 242. The second E/D factor 244 ranges from about 0.2 to about 0.5 in some examples. Note the deposition at the first deposition step 234 is not selective or has no enough selectivity. Any unexpected deposition to other regions (such as STI features and gate stack) during the first deposition step will be removed during the second deposition step due to the increased etching effect.

In the operation 232, the corresponding deposition technique may be a CDE process, co-flow epitaxy growth or a combination. In some other embodiments, as long as the two deposition steps are tuned to address the metal related defects and deposition selectivity, the deposition gas (not etching gas) may include chlorinated chemical. For example, the $SiH_2Cl_2$ may be used as a silicon-containing gas in the operation 232.

In some examples, the epitaxy deposition process 232 is a CDE process. The first deposition step 234 has a HCl (or $Cl_2$) partial pressure less than 100 Torr for the etch cycle(s) while the second deposition step 236 has a HCl (or $Cl_2$) partial pressure greater than 100 Torr for the etch cycle(s). In some other examples, the epitaxy deposition process 232 is a co-flow epitaxy epitaxy growth. The first deposition step 234 has a HCl (or $Cl_2$) partial pressure less than 3 Torr while the second deposition step 236 has a HCl (or $Cl_2$) partial pressure greater than 3 Torr.

In some other examples, the epitaxy deposition process 232 is a co-flow epitaxy growth (or a CDE process). The E/D factor is tuned by the substrate temperature. As noted above, the etch effect is apparent when the substrate temperature is greater than 620° C. The first deposition step 234 has a first substrate temperature less than about 620° C. and the second deposition step 236 has a second substrate temperature greater than 620° C.

In some other embodiments, the operation 232 uses a co-flow epitaxy growth that with two steps: a first deposition step 234 with a first E/D factor and a second deposition step 236 with a second E/D factor greater than the first E/D factor. During the co-flow epitaxy growth, the deposition gas and etching gas are dynamically controlled, such as by controlling gas flow rates, to dynamically change the E/D factor with considerations similar to those described with the CDE process. For example, the etching gas flow rate is initially zero or lower. Then the etch gas flow rate increases over processing time. At the first deposition step 234, the chlorine (e.g., HCl) gas partial pressure in the processing chamber is low, such as ranging from about 1 Torr to about 10 Torr in some examples. At the second deposition step 236, the chlorine gas partial pressure in the processing chamber is greater than that of the first deposition step 225, such as ranging from about 200 Torr to about 250 Torr in some examples.

Figure 17:
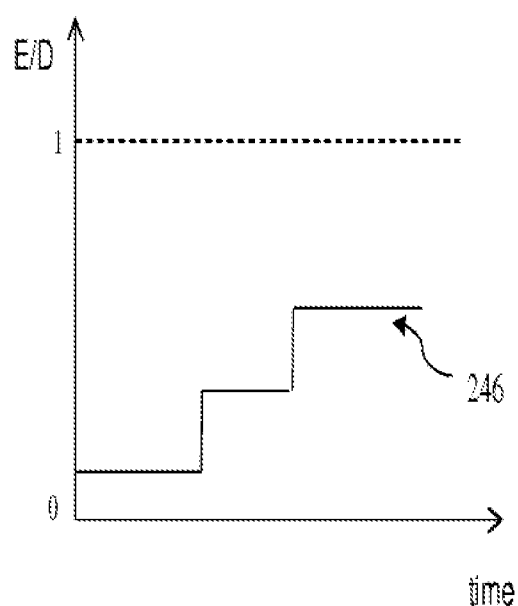
FIG. 17 illustrates a deposition process in the method of FIG. 15 and the corresponding E/D factor in accordance with some other embodiments.

In some other embodiments, the epitaxy deposition process 232 is designed such that the E/D factor has a step-wise variation over the process. As illustrated in FIG. 17, the E/D factor 246 is step-wise over the process time. Again, the variation of the E/D factor may be implemented through one or more mechanisms, such as gas flow, gas partial pressure, and substrate temperature. The deposition mechanism may be CDE, co-flow epiatxy growth or a combination.

Figure 18:
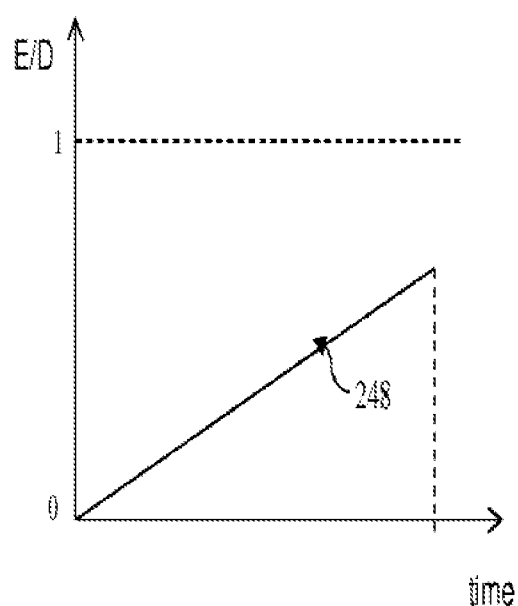
FIG. 18 illustrates a deposition process in the method of FIG. 15 and the corresponding E/D factor in accordance with some other embodiments.
Figure 19:
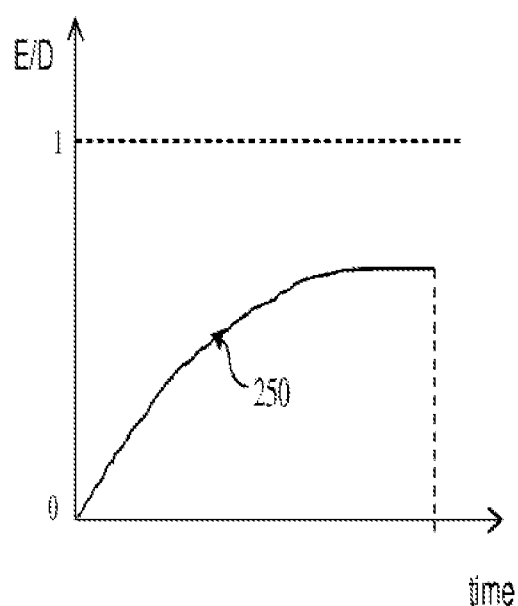
FIG. 19 illustrates a deposition process in the method of FIG. 15 and the corresponding E/D factor in accordance with some other embodiments.

In some embodiments, the operation 232 is designed such that the E/D factor varies continuously over the process. The E/D factor varies in a range from 0 to 1. During the operation 232, the E/D factor dynamically changes for various considerations that include the deposition selectivity, the metal assisted silicon etching issues and/or deposition quality. Initially, the metal assisted silicon etching issues is the prime concern, so the E/D factor is chosen to be lower. At the later stage of the operation 232, the deposition selectivity is a dominant while the metal assisted silicon etching issue is subordinate. Therefore, the E/D factor is increased. The E/D factor may be is a proper function of the process time, such as a linear function or a non-linear function. Illustrated in FIG. 18 is an example that the E/D factor 248 is a linear function of the process time. Illustrated in FIG. 19 is another example that the E/D factor 250 is a non-linear function of the process time. It may be tuned and optimized for better fabrication result in consideration of various factors, such as the semiconductor material to be deposited, processing throughput, and device tolerance range to the defects associated with the metal assisted silicon etching effect.

Other fabrication steps may be implemented before, during and after the operations of the method. In one embodiment, an inter-level dielectric (ILD) layer is formed on the semiconductor substrate. The ILD layer includes silicon oxide, low k dielectric material, other suitable dielectric materials, or combinations thereof. The ILD layer is formed by a suitable technique, such as CVD. For example, high density plasma CVD may be implemented to form the ILD layer. In another embodiment, a gate replacement procedure may be implemented to form a final gate stack having high k dielectric and metal gate electrode. In another embodiment, the method further includes a procedure to form various interconnection features designed to couple various devices to form a functional circuit.

The present disclosure provides a method and structure of a FET that addressing the defect issue associated with the metal residuals and chlorine. The method includes forming a passivation layer in the recesses of the semiconductor substrate before expitaxially growing a semiconductor material to form S/D features in the recesses. The passivation layer is designed with composition, thickness and configuration to effectively prevent the interaction between Cl-containing chemical and the metal residual in the recesses. In other embodiments, a fluorine treatment is further applied to the passivation layer to enhance its effectiveness. In other embodiments, the method implements a deposition method to epitaxially growing S/D features with a varying E/D factor. The E/D factor varies over the processing time to address the defect issue associated with the metal residuals and chlorine. The E/D factor is chosen to be lower initially to address the defect issue, and then is increased over time to enhance the deposition selectivity.

The semiconductor structure 100 may be used in various applications, such as logic circuit, dynamic random access memory (DRAM), static random access memory (SRAM) cells, flash memory, or imaging sensor. The semiconductor structure is a planar FET structure or alternatively a FinFET structure. In other embodiments, the disclosed method to selectively deposit a semiconductor material layer may be used to form other epitaxy features with substantially reduced metal sensitivity during the process. In one example for a FET with epitaxy grown channel region, the method is described below: the dummy gate is removed to form a gate trench; the substrate is recessed within the gate trench; epitaxially growing a semiconductor material in the recessed region by the disclosed deposition method.

The present disclosure provides a method forming a field effect transistor (FET) in accordance with some embodiments. The method includes performing an etching process to a semiconductor substrate, thereby forming recesses in source and drain (S/D) regions of the semiconductor substrate; forming a passivation material layer of a first semiconductor in the recesses; and epitaxially growing a second semiconductor material, thereby forming S/D features in the recesses, wherein the S/D features are separated from the semiconductor substrate by the passivation material layer.

The present disclosure provides a method forming a field effect transistor (FET) in accordance with some other embodiments. The method includes performing an etching process to a semiconductor substrate, thereby forming recesses in source and drain (S/D) regions of the semiconductor substrate; and epitaxially growing a semiconductor material by a deposition process with a varying etching/deposition (E/D) factor, thereby forming S/D features in the recesses.

The present disclosure provides an integrated circuit structure in accordance with some embodiments. The integrated circuit structure includes a semiconductor substrate of a first semiconductor material and having first recesses; a first gate stack formed on the semiconductor substrate and being adjacent the first recesses; a passivation material layer of a second semiconductor material and formed in the first recesses; and first source and drain (S/D) features of a third semiconductor material and formed in the first recesses and being separated from the semiconductor substrate by the passivation material layer, wherein the passivation material layer is free of chlorine.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
a first gate stack disposed over a first fin structure;
a first source/drain feature disposed on the first fin structure, wherein the first source/drain feature is formed of a first semiconductor material that includes a first-type dopant;
a first passivation material layer disposed within the first fin structure and interfacing with a first side and a second side of the first source/drain feature, the first side of the first source/drain feature being opposite the second side of the first source/drain feature, the first passivation material layer formed of a second semiconductor material that includes a second-type dopant, the second-type being opposite the first-type, wherein the second semiconductor material that includes the second-type dopant interfaces with the first semiconductor material that includes the first-type dopant of the first source/drain feature; and
a second source/drain feature disposed in the first fin structure, the second source/drain feature including a first portion extending from the first passivation material layer that is interfacing with the first source/drain feature to under the first gate stack.

2. The device of claim 1, wherein the second source/drain feature includes the second-type dopant, and
wherein the first-type dopant is a p-type dopant and the second-type dopant is an n-type dopant.

3. The device of claim 1, wherein the first semiconductor material includes germanium, and
wherein the second semiconductor material includes silicon.

4. The device of claim 1, further comprising:
a second gate stack disposed over a second fin structure;
a third source/drain feature disposed on the second fin structure, wherein the second source/drain feature is formed of a third semiconductor material that includes the second-type dopant;
a second passivation material layer disposed within the second fin structure and interfacing with a third side and a fourth side of the third source/drain feature, the third side of the third source/drain feature being opposite the fourth side of the third source/drain feature, the second passivation material layer formed of the second semiconductor material that includes the second-type dopant, wherein the second semiconductor material that includes the second-type dopant interfaces with the third semiconductor material that includes the second-type dopant of the third source/drain feature.

5. The device of claim 4, further comprising a fourth source/drain feature disposed in the second fin structure, the fourth source/drain feature including a third portion extending from the second passivation material layer that is interfacing with the third source/drain feature to under the second gate stack.

6. The device of claim 4, further comprising a shallow trench isolation structure extending from the first fin structure to the second fin structure.

7. The device of claim 1, wherein the first-type dopant includes boron, and
wherein the second-type dopant includes phosphorous.

8. The device of claim 1, wherein the first passivation material layer disposed within the first fin structure prevents any portion of the first source/drain feature from interfacing with the first fin structure.

9. A device comprising:
- a first gate stack disposed over a substrate;
- a first source/drain feature disposed on the substrate and formed of a first semiconductor material, the first source/drain feature having a first sidewall;
- a passivation material layer disposed within the substrate and interfacing with a first portion of the first sidewall of the first source/drain feature such that the passivation material layer prevents the first portion of the first sidewall of the first source/drain feature from interfacing with the substrate, the passivation material layer formed of a second semiconductor material that is different than the first semiconductor material, wherein a second portion of the first sidewall is free of the passivation layer; and
- a second source/drain feature disposed in the substrate and extending from the passivation material layer that is interfacing with the first sidewall of the first source/drain feature to under the first gate stack, and
- wherein the passivation material layer includes a first dopant having a first-type of conductivity and the first source/drain feature includes a second dopant having a second-type of conductivity that is opposite the first-type of conductivity.

10. The device of claim 9, wherein the second portion of the first sidewall of the first source/drain feature extends above a top surface of the substrate.

11. The device of claim 9, wherein the second source/drain feature includes a first portion disposed on a first side of the first source/drain feature and a second portion disposed on a second side of the source/drain feature.

12. The device of claim 11, wherein the passivation material layer is positioned between the first and second portions of the second source/drain feature and the first source/drain feature thereby preventing the second source/drain feature from interfacing with the first source/drain feature.

13. The device of claim 9, further comprising a doped well feature disposed in the substrate and at least partially surrounding the passivation material layer,
- wherein the passivation material layer prevents the first source/drain feature from interfacing with the doped well feature, and
- wherein the second source/drain feature interfaces with the doped well feature.

14. The device of claim 13, wherein the doped well feature includes a third dopant having the first-type of conductivity, and
- wherein the second source/drain feature includes a fourth dopant having the second-type of conductivity.

15. The device of claim 9, wherein a top surface of the first source/drain feature and a top surface of the second source/drain feature extend to the same height above the substrate.

16. The device of claim 9, wherein the first-type of conductivity is n-type of conductivity and the second-type of conductivity is p-type.

17. A device comprising:
- a substrate;
- a passivation material layer that includes a first portion and a second portion disposed within the substrate and formed of a first semiconductor material that includes a first dopant of a first type; and
- a first source/drain feature disposed within the substrate, the first source/drain feature having a first bottom surface interfacing with the first portion of the passivation material layer, the first source/drain feature formed of a second semiconductor material that includes a second dopant of the first type; and
- a second source/drain feature disposed within the substrate, the second source/drain feature having a second bottom surface and interfacing with the second portion of the passivation material layer, the second source/drain feature formed of a third semiconductor material that includes a third dopant of a second type, the third semiconductor material interfacing with the second portion of the passivation material layer, and the second type being opposite the first type.

18. The device of claim 17, further comprising:
- a dielectric isolation structure disposed in the substrate between the first and second source/drain features;
- a third source/drain feature extending from the first portion of the passivation material layer to the dielectric isolation structure; and
- a fourth source/drain feature extending from the second portion of the passivation material layer to the dielectric isolation structure.

19. The device of claim 18, wherein the third source/drain feature includes a fourth dopant of the second type, and
- wherein the fourth source/drain feature includes a fifth dopant of the first type.

20. The device of claim 14, wherein the first dopant and the second dopant are the same.

* * * * *